United States Patent
Watanabe et al.

[11] Patent Number: 6,023,293
[45] Date of Patent: Feb. 8, 2000

[54] ACTIVE TYPE SOLID-STATE IMAGING DEVICE

[75] Inventors: Takashi Watanabe, Soraku-gun; Hiroaki Kudo, Nara, both of Japan

[73] Assignee: Sharp Kabushiki Kaisha, Osaka, Japan

[21] Appl. No.: 08/813,709

[22] Filed: Mar. 7, 1997

[30] Foreign Application Priority Data

Mar. 12, 1996 [JP] Japan ................................. 8-055234

[51] Int. Cl.[7] .............................. H04N 3/14; H04N 9/083
[52] U.S. Cl. ......................... 348/294; 348/311; 257/291
[58] Field of Search .................................. 348/311, 294; 257/443, 290, 291, 258, 257

[56] References Cited

U.S. PATENT DOCUMENTS

| | | | |
|---|---|---|---|
| 5,486,711 | 1/1996 | Ishida | 257/258 |
| 5,780,884 | 7/1998 | Kumagai et al. | 257/236 |
| 5,844,234 | 12/1998 | Kawazoe | 250/208.1 |
| 5,861,645 | 1/1999 | Kudo et al. | 257/291 |
| 5,880,494 | 3/1999 | Watanabe | 257/291 |

FOREIGN PATENT DOCUMENTS

| | | |
|---|---|---|
| 6-1826 | 1/1994 | Japan . |
| 8-78653 | 3/1996 | Japan . |
| 8-250697 | 9/1996 | Japan . |

OTHER PUBLICATIONS

C. Nakamura, et al., *1986 Television Academy*, p. 57, 1986.
J. Hynecek, *IEEE Transactions on Electron Devices*, vol. 35, No. 5 pp. 646–652, 1988.
J. Hynecek, *IEEE Transactions on Electron Devices*, vol. 38, No. 5 pp. 1101–1020, 1991.
K. Matsumoto, et al., *IEEE Transactions on Electron Devices*, vol. 38, No. 5, pp. 989–998, 1991.
E.R. Fossum, *IEEE IDEM 95*, pp. 17–25, 1995.

*Primary Examiner*—Wendy Garber
*Assistant Examiner*—Carramah J. Quiett
*Attorney, Agent, or Firm*—David G. Conlin; David A. Tucker

[57] ABSTRACT

In the active type solid-state imaging device of the present invention, the image sensor portion and the driving circuit portion which drives the image sensor portion or conducts signal processing are formed in separate semiconductor regions in the identical semiconductor substrate.

8 Claims, 23 Drawing Sheets

FIG. 22 PRIOR ART

ACTIVE TYPE SOLID-STATE IMAGING DEVICE

BACKGROUND OF THE INVENTION

1. Field of the Invention

The present invention relates to an active type solid-state imaging device using a metal-oxide-semiconductor field-effect transistor (hereinafter, referred to as "MOSFET") or a junction gate FET. More particularly, the present invention relates to an active type solid-state imaging device which can realize an excellent performance and a lower driving voltage.

2. Description of the Related Art

An active type solid-state imaging device has been proposed as a replacement for a currently used imaging device using a charge-coupled device (CCD). In the active type solid-state imaging device, signal charges generated in respective pixels are not read out by themselves, but are read out by a scanning circuit after the signal charges have been amplified in the respective pixels. Such a device eliminates the limit on the signal magnitude and makes a dynamic range broader than that of Et CCD type imaging device. Moreover, in such a device, since the signal charges are read out by driving the pixels to be read out only in a horizontal and perpendicular line with a lower voltage, a smaller amount of power consumption is required than that of a CCD type imaging device.

In such a device, a transistor is generally employed to amplify the signal charges in a pixel; an SIT type, a bipolar type, an FET type (an MOS type or a junction type), and the like have been proposed. Since it is generally easier to employ MOSFETs in a scanning circuit, considering the configuration of the device, it is more advantageous to use FET type pixels. More preferably, it is advantageous to use a device in which only a single FET is contained inside a pixel in order to increase the pixel density. A charge modulation device (CMD) type, a floating gate array (FGA) type, and a bulk charge modulation device (BCMD) type have been reported as active type imaging devices.

FIGS. 12A and 12B show CMD type pixels of a conventional active type solid-state imaging device, in which a plurality of pixels are arranged in a matrix. FIG. 12A is a plan view of the pixels, and FIG. 12B is a cross-sectional view taken along a line 12B—12B in FIG. 12A. FIG. 13 shows a potential distribution in a perpendicular direction taken along a line 13—13 in FIG. 12B. The active type solid-state imaging device shown in these figures is described in Nakamura et al., "Gate-accumulation type MOS phototransistor image sensor", 1986 Television Academy, p. 57. As is apparent from FIG. 12B, an n-well 2 is formed as a buried channel in a p-substrate 1. A gate electrode 3 is formed on the n-well 2 with an insulating film 6 therebetween. A source region 4 and a drain region 5, composed of a highly-concentrated n-layer and separated by the n-well 2, are formed in the n-well 2. As shown in FIG. 12A, the gate electrodes 3 of the respective pixels are connected in common to gate terminals 7 in a horizontal direction, and the respective source regions 4 are connected in common to source terminals 8 in a vertical direction.

An operation of the CMD type pixel will be described with reference to FIG. 13. First, at the time of signal accumulation, a gate voltage is set to be a voltage $V_L$ and signal charges (holes) generated by photoelectric conversion are accumulated in an interface between the semiconductor and the insulating film. Then, at the time of signal reading, the gate voltage is set to be a voltage $V_M$, which is a higher potential than the voltage $V_L$, and a current between the source and the drain regions 4 and 5 varies in accordance with the amount of the signal charges. The varied value of the current is read out as a signal output. The other pixels on the same source terminal 8 are not detected because the gate voltage is in a $V_L$ level. That is, only the selected pixels are read out. At the time of the resetting operation, by which signal charges are cleared to be ready for the next signal accumulation, the gate voltage is set to be a voltage $V_H$, so that the potential in the substrate decreases along a direction perpendicular to the substrate. The signal charges (holes) accumulated in the interface between the n-well 2 and the insulating film 6 are then discharged into the substrate 1 under the interface, as shown by the broken lines in FIG. 12B.

A conventional CMD type imaging device has the following shortcomings. First, the gate voltage at the time of the resetting operation must be very high because the concentration of the impurity in the buried n-well channel layer should be set to be high so that the density of the accumulated signal charges may be high. For example, a case of employing the following Condition 1 will be analyzed.

[Condition 1]
Impurity concentration of the substrate: $1.0 \times 10^{15}$ cm$^{-3}$
Impurity concentration of the n-layer: $3.0 \times 10^{15}$ cm$^{-3}$
Thickness of the n-layer: 1.5 μm
Thickness of the gate insulating film: 80 nm Using this condition, the condition where the potential decreases linearly from the surface of the n-well 2 to the p-substrate 1 is expressed as follows:

[Equation 1]

$$V_G = \frac{qN_n}{2K_s\varepsilon_0}\left(1 + \frac{N_n}{N_p}\right)d_n^2 - V_{FB} \tag{1}$$

$$= 20.88 - 0.85 = 20.03 \text{ v}$$

$N_n$: Carrier concentration of the n-well
$N_p$: Carrier concentration of the p-substrate
$K_s$: S relative dielectric constant
$\varepsilon_0$: Vacuum dielectric constant
$\varepsilon$: Elementary electric charge
$d_n$: $X_j$ (junction depth) of the n-well
$Y_{FB}$: Flat band voltage As a result, the gate voltage $V_G$ required for the resetting operation is 20.0 volts if a flat band voltage $V_{FB}$ is −0.85 volts; therefore, the gate voltage $V_G$ is an impractical value.

In a conventional CMD type imaging device, another problem occurs because the depletion of the interface between the n-well 2 and the insulating film 6 causes the generation of a considerable dark current.

An FGA type imaging device is employed among the active type solid-state imaging devices of the FET type to reduce the generation of the dark current. FIG. 14A shows a cross-sectional view of an FGA type imaging device. FIG. 14B shows a potential distribution in a direction taken along the line 14B—14B in FIG. 14A. The prior art device shown in these figures is described in J. Hynecek, "A New Device Architecture Suitable for High-Resolution and High-Performance Image Sensor", IEEE Trans. Elec. Dev., p. 646 (1988).

This FGA type imaging device is different from the CMD type imaging device in that a p-layer 9 in a relatively high concentration is provided on the n-well 2 under the gate electrode 3, as shown in FIG. 14A. A gate voltage is set to be $V_L$ at the time of the signal accumulation and the signal reading, and the variation of the channel potential of the n-well 2 is detected as a variation of the threshold value in accordance with the accumulation of the signal charges (holes) in the p-layer 9. The other pixels on the same signal line are not detected because the gate voltage is in a $V_L$ level only at the time of the signal reading.

In this FGA type imaging device, a similar reading operation is conducted to that of the CMD type imaging device, i.e., the gate voltage is set to be $V_H$ which makes a potential in the substrate decrease linearly in a direction perpendicular to the substrate. The signal charges (holes) accumulated in the p-layer 9 are discharged into the substrate 1 under the p-layer 9. According to this structure, the p-layer 9 is not depleted even at the time of the resetting operation, so the generation of the dark current is reduced. However, if the p-layer 9 is not depleted at the time of the resetting operation, the signal charges are not completely transferred. Consequently, the generation of residual images and the increase of resetting noise cannot be prevented.

A BCMD type imaging device is proposed to improve the defects of the FGA type imaging device in J. Hynecek, "BCMD—An Improved Photosite Structure for High Density Image Sensor", IEEE Trans. Elec. Dev., p. 1011 (1991). FIG. 15A shows a cross section of a BCMD type pixel, and FIG. 15B shows a potential distribution in a direction taken along the line 15B—15B in FIG. 15A. As shown in FIG. 15A, in a BCMD type imaging device, a p-layer 11, an n-layer 12, and a p-layer 13 are stacked in this order on an n-substrate 10. P-layers in a high concentration 14 are formed for a source electrode and a drain electrode so as to reach the p-layer 11 through the n-layer 12 and the p-layer 13.

This BCMD type imaging device is different from the FGA type imaging device in the following points:

1) The signal charges are converted into electrons and accumulated in the buried channel n-layer 12.

2) The potential variation of the p-layer 13 caused by the signal charges are detected as a variation of the threshold value of the p-MOS structure.

3) At the time of the resetting operation, the gate voltage is set to be lower ($V_L$) and the signal charges are discharged into the n-substrate 10.

Accordingly, the complete transfer of the signal charges is accomplished. However, the p-n-p-n multilayered structure of this device makes it difficult to optimize the driving conditions and makes the fabrication steps complicated.

In order to overcome the problems of the above-mentioned respective active type solid-state imaging devices, the applicant of the present application has proposed two kinds of pixels with novel structures in the followings: Japanese Patent Application No. 6-303953 and Japanese Laid-Open Patent Publication No. 8-250697.

FIG. 16 shows a twin gate MOS image sensor (TGMIS) type pixel disclosed in Japanese Patent Application No. 6-303953. A first gate electrode 22 (photo-gate) and a second gate electrode 23 (reset-gate) are formed on a p-type semiconductor substrate 21 with an insulating film 27 therebetween. An n-type semiconductor layer 24 is formed in a surface region of the p-type semiconductor substrate 21 under the first gate electrode 22, and a pair of n$^+$ diffusion layers are formed in the n-type semiconductor layer 24. One n$^+$ diffusion layer forms a source region 25 of MOSFET and the other n$^+$ diffusion layer forms a drain region 26. The first gate electrode 22 works as a gate.

In the above-mentioned structure, light hυ incident through the first gate electrode 22 generates an electron-hole pair by photoelectric conversion, while the electrons flow into the drain region 26. The holes are collected by a potential barrier formed in the middle of the n-type semiconductor layer 24 and a potential barrier formed under the second gate electrode 23 and turned into the signal charges accumulated in the interface between the insulating layer 27 and the n-type semiconductor layer 24.

The amount of the potential variation in the n-type semiconductor layer 24 in accordance with the amount of the signal charges is detected as a potential variation at the source region 25 and regarded as an output signal. The signal charges are easily discharged along the route shown by the broken line in FIG. 16 into the p-type semiconductor substrate 21 by lowering the potential barrier under the second gate electrode 23. In the structure shown in FIG. 16, a sufficiently large amount of signal charges can be accumulated in the surface region and the resetting operation can be conducted at a low voltage.

In FIG. 16, the reference numeral 32 denotes a first gate region under the first gate electrode 22 of the n-type semiconductor layer 24, and the reference numeral 33 denotes a reset region under the second gate electrode 23.

FIG. 17 shows an image sensor portion A in which pixels shown in FIG. 16 are arranged in matrix. The first gate electrodes 22 are connected in common to a first vertical scanning circuit 40 through clock lines 30 denoted by $V_A(i)$, $V_A(i+1)$, etc. in a horizontal direction in FIG. 17. The second gate electrodes 23 are connected in common to a second vertical scanning circuit 41 through clock lines 31 denoted by $V_B(i)$, $V_B(i+1)$, etc. in a horizontal direction.

The source region 25 is formed per pixel in the middle of the first gate region 32 of the n-type semiconductor layer 24. The source regions 25 are connected in common to signal lines 28 denoted by $V_S(j)$, $V_S(j+1)$, etc. in a column direction of the pixels. The drain regions 26 are formed in the periphery of each pixel as shown by hatched portions and are supplied with a voltage $V_D$ through drain terminals 29 from the periphery thereof.

FIG. 22 shows Bulk Drain MOS Image Sensor (BDMIS) type pixels proposed in Japanese Patent Application No. 7-51641. An n-well 1022 is formed in a p-type semiconductor substrate 1021 so as to be in contact with a surface 1051 of the p-type semiconductor substrate 1021. A p$^+$-source 1023 is formed in the n-well 1022 so as to be in contact with the surface 1051. A first gate electrode 1024 is formed on a region of the n-well 1022 excluding the p$^+$-source 1023 with an insulating film 1061 formed therebetween. A second gate electrode 1025 is formed on a region of the p-type semiconductor substrate 1021 adjacent to the n-well 1022 with the insulating film 1061 formed therebetween. A portion 1053 in the vicinity of the surface of the n-well 1022, the insulating film 1061, and the first gate electrode 1024 collectively form a first gate region 1055.

A portion 1054 in the vicinity of the surface of the p-type semiconductor substrate 1021, the insulating film 1061, and the second gate electrode 1025 collectively form a second gate region 1056.

When an appropriate voltage is applied to the first gate electrode 1024, a p-channel is formed by minority carriers (holes) in the portion 1053. When an appropriate voltage is applied to the second gate electrode 1025, a p-channel is formed in an entire region of the p-type semiconductor substrate 1021 below the second gate electrode 1025 including the portion 1054. Thus, a channel for allowing an electric current (holes) to flow is formed between the p-type semiconductor substrate 1021 with a voltage $V_D$ applied thereto and the p$^+$-source 1023 with a voltage $V_S$ applied thereto. As a result, an electric current flows as represented by a solid line in FIG. 22.

When light hυ is incident through the first gate electrode 1024, it generates an electron-hole pair by photoelectric conversion in the n-well 1022 positioned below the first gate electrode 1024 and the p-type semiconductor substrate 1021. The generated holes flow into the p$^+$-source 1023, while the electrons are collected by a potential barrier formed in the middle of the n-well 1022 and turned into the signal charges. The electrons which are turned into the signal charges are majority carriers in the n-well 1022. The accumulated signal charges vary the potential of the n-well 1022 in accordance with the charge amount, and further vary the surface potential of the portion 1053.

Accordingly, an electric current flowing through the p-type semiconductor substrate 1021 and the p$^+$-source 1023 varies in accordance with the amount of the accumulated signal charges. If a constant current is allowed to flow between the p-type semiconductor substrate 1021 and the p$^+$-source 1023, an electric potential between the p-type semiconductor substrate 1021 and the p$^+$-source 1023 varies in accordance with the amount of the accumulated signal charges. Furthermore, if a constant electric potential is kept between the p-type semiconductor substrate 1021 and the p$^+$-source 1023, a current flowing between the p-type semiconductor substrate 1021 and the p$^+$-source 1023 varies in accordance with the amount of the accumulated signal charges. In this manner, a first transistor is formed between the p-type semiconductor substrate 1021 and the p$^+$-source 1023, using the portions 1053 and 1054 as channels, and the electrical characteristics of the transistor change depending upon the amount of the accumulated signal charges.

Furthermore, a reset drain region 1026 is provided in the p-type semiconductor substrate 1021 in such a manner that the reset drain region 1026 is formed adjacent to the portion 1054 so as to be in contact with the surface 1051. When an appropriate voltage $V_B$ is applied to the second gate electrode 1025 so as to lower a potential barrier of the portion 1054 of the second gate region 1056, the signal charges accumulated in the n-well 1022 flow into the reset drain region 1026 along a route represented by a dotted line in FIG. 22. In this manner, a second transistor is formed between the n-well 1022 and the reset drain region 1026, using the portion 1054 as a channel, whereby signal charges are discharged.

FIG. 23 shows an image sensor portion in which the pixels shown in FIG. 22 are arranged in matrix. The first gate electrodes 1024 are connected in common to a first vertical scanning circuit 40 through clock lines denoted by $V_A(i)$, $V_A(i+1)$, etc. in a horizontal direction in FIG. 23. The second gate electrodes 1025 are connected in common to a second vertical scanning circuit 41 through clock lines denoted by $V_B(i)$, $V_B(i+1)$, etc. in a horizontal direction.

The source region 1023 is formed per pixel at the center of the first gate region 1055 of the n-well 1022. The source regions 1023 are connected in common to signal lines 1034 denoted by $V_S(j)$, $V_S(j+1)$, etc. in a column direction of the pixels. The substrate 1021 is used as a drain region, such that it is not shown in FIG. 23.

FIG. 24 is a cross-sectional view of an active type solid-state imaging device (corresponding to a cross section taken along a line PQR in FIG. 17) in which an image sensor portion A being formed of the TGMIS-type pixels described with reference to FIG. 16 and a driving circuit portion B are provided on a p-type semiconductor substrate 120'.

The portions in the image sensor portion A corresponding to those shown in FIG. 16 are denoted by the reference numerals identical with those of FIG. 16; specific descriptions thereof will be omitted here. The driving circuit portion B corresponds to the second vertical scanning circuit 41 (shown in FIG. 17) composed of a complementary metal oxide semiconductor (CMOS) inverter.

A substrate electric potential $V_{SUB}$ is supplied to the driving circuit portion B through a p$^+$-region 101 formed on the surface of the p-type semiconductor substrate 120'. A well 130 with the same conductivity as that of the p—type semiconductor substrate 120' and a well 140 with the conductivity opposite to that of the p-type semiconductor substrate 120' are formed on the p-type semiconductor substrate 120'. An electric potential $V_L$ is applied to the well 130 through the p$^+$-region 131. On the other hand, an electric potential $V_H$ is applied to the well 140 through an n$^+$-region 141.

In the case where the active type solid-state imaging device of the TGMIS type is driven, a pulse generated by a vertical scanning circuit for the first gate electrode (photogate electrode) has an amplitude of $V_L$-$V_H$, and a pulse generated by a vertical scanning circuit for the second gate electrode (reset-gate electrode) has an amplitude of $V_M$-$V_H$ ($V_L \leq V_M \leq V_H$). Therefore, when the image sensor portion A and the driving circuit portion B are formed on the identical p-type semiconductor substrate, the image sensor portion A is required to be positioned far away from the driving circuit portion B in accordance with the required difference in electric potential. This prevents the improvement of integration and limits the degree of freedom of a driving voltage. Furthermore, when different voltages are set on the identical substrate, even if the image sensor portion A is positioned far away from the driving circuit portion B, an invalid current is generated by the difference in set electric potentials. This also allows a parasitic bipolar transistor or a parasitic thyristor to operate, leading to malfunction.

The above-mentioned problems arise in the TGMIS-type imaging device and the BDMIS-type imaging device, as well as the improved TGMIS-type imaging device. This is because the image sensor portion and the driving circuit portion are formed on the identical semiconductor layer in either of the devices.

SUMMARY OF THE INVENTION

An active type solid-state imaging device of the present invention, includes: an image sensor portion having an active type photoelectric conversion element, formed in a first semiconductor layer of a second conductivity type in a semiconductor substrate of a first conductivity type; and a driving circuit for driving the image sensor portion, formed in a second semiconductor layer of the second conductivity type in the semiconductor substrate. In this device, the active type photoelectric conversion element includes: a transistor which accumulates signal charges generated from incident light on a surface of the first semiconductor layer and outputs changes in an electric signal in accordance with the accumulated signal charges; and a gate region provided adjacent to the transistor, which includes: a part of the first semiconductor layer; a first insulating film formed on the part of the first semiconductor layer; and a gate electrode provided on the first insulating film, and which transfers the accumulated signal charges from the surface of the first semiconductor layer to an inside portion of the first semiconductor layer based on a voltage applied to the gate electrode, and the first semiconductor layer and the second semiconductor layer are formed so as to be separated from each other on the semiconductor substrate.

An active type solid-state imaging device of the present invention, includes: an image sensor portion having an active type photoelectric conversion element, formed in a first semiconductor layer of a second conductivity type in a semiconductor substrate of a first conductivity type; and a driving circuit for driving the image sensor portion, formed in a second semiconductor layer of the second conductivity type in the semiconductor substrate. In this device, the active type photoelectric conversion element includes: a transistor including: a first gate region having a portion of a surface region of the first semiconductor layer in which signal charges generated by photoelectric conversion are accumulated and a first gate electrode formed on the surface region of the first semiconductor layer; and a source and a drain made of layers having an impurity concentration higher than an impurity concentration of the first semiconductor layer, formed on the surface of the first semiconductor layer; and a charge discharging portion including: a second gate region having a portion of the surface region of the first semiconductor layer adjacent to the first gate region and a second gate electrode formed on the surface region of the first semiconductor layer with an insulating layer interposed therebetween so as to be adjacent to the first gate electrode; and a second drain for discharging charges made of a layer having an impurity concentration higher than the impurity concentration of the first semiconductor layer, formed in a portion on a surface of the first semiconductor substrate, the portion having a predetermined distance from a portion adjacent to the first gate electrode and the second gate electrode along a surface direction of the first semiconductor layer, the accumulated signal charges are discharged to the second drain for discharging charges, and the first semiconductor layer and the second semiconductor layer are formed so as to be separated from each other on the semiconductor substrate.

An active type solid-state imaging device of the present invention, includes: an image sensor portion formed in a first semiconductor layer of a second conductivity type in a semiconductor substrate of a first conductivity type, having a plurality of active type photoelectric conversion elements arranged one-dimensionally or two-dimensionally; and a driving circuit for driving the image sensor portion, formed in a second semiconductor layer of the second conductivity in a semiconductor substrate. In this device, each of the active type photoelectric conversion elements has: a transistor including: a first gate region having a portion of a surface region of the first semiconductor layer in which signal charges generated by photoelectric conversion are accumulated and a first gate electrode formed on the surface region of the first semiconductor layer; and a source and a drain made of layers having an impurity concentration higher than an impurity concentration of the first semiconductor layer, formed on the surface of the first semiconductor layer; and a charge discharging portion including: a second gate region having a portion of the surface region of the first semiconductor layer adjacent to the first gate region and a second gate electrode formed on the surface region of the semiconductor layer with an insulating film interposed therebetween so as to be adjacent to the first gate electrode, and discharging the signal charges accumulated in the first gate region into the first semiconductor layer through the second gate region, wherein a current blocking portion is provided between the charge discharging portion of a first active type photoelectric conversion element and the transistor of a second active type photoelectric conversion element adjacent to the first active type photoelectric conversion element, and the first semiconductor layer and the second semiconductor layer are formed so as to be separated from each other on the semiconductor substrate.

An active type solid-state imaging device of the present invention, includes: an image sensor portion including an active type photoelectric conversion element, formed in a first semiconductor layer of a second conductivity type in a semiconductor substrate of a first conductivity type; and a driving circuit for driving the image sensor portion, formed in a second semiconductor layer of the second conductivity in the semiconductor substrate. In this device, the active type photoelectric conversion element includes a transistor comprising: a semiconductor region provided on a surface of the first semiconductor layer; a first gate region including a portion of a surface region of the first semiconductor layer in which signal charges generated by photoelectric conversion are accumulated and a first gate electrode formed on the portion of the surface region of the first semiconductor layer; and a second gate region formed on the portion of the surface region of the first semiconductor layer adjacent to the first gate region with an insulating film interposed therebetween, a channel is formed in the portion in the vicinity of the surface of the first gate region between the semiconductor region and the first semiconductor layer and changes in characteristics of the transistor caused by the signal charges are output, and the first semiconductor layer and the second semiconductor layer are formed so as to be separated from each other on the semiconductor substrate.

In one embodiment of the present invention, a semiconductor layer of a second conductivity type having an impurity concentration higher than an impurity concentration of the first and second semiconductor layers is formed between the first semiconductor layer and the semiconductor substrate and between the second semiconductor layer and the semiconductor substrate.

In another embodiment of the present invention, a semiconductor layer of a second conductivity having an impurity concentration higher than an impurity concentration of the first and second semiconductor layers is formed between the first semiconductor layer and the semiconductor substrate and between the second semiconductor layer and the semiconductor substrate.

As described above, in the active type solid-state imaging device of the present invention, the image sensor portion and the driving circuit portion which drives the image sensor portion or conducts signal processing are formed in separate semiconductor regions in the identical semiconductor substrate. Therefore, the electric potential in the respective regions can be set independently. This allows a driving voltage to be varied in the driving circuit portion, whereby the driving voltage can be optimized. Furthermore, the voltage in the signal processing portion can also be set independently, so that a broader dynamic range is obtained.

Furthermore, in the vicinity of a junction portion between the semiconductor substrate of a first conductivity type and the first semiconductor layer of a second conductivity type, the second semiconductor layer with the second conductivity type having a concentration higher than that of the first semiconductor layer is formed. This prevents a complete depletion in the junction portion. Therefore, the electric potentials of wells can be uniformly fixed in the image sensor portion and the driving circuit portion, respectively.

Thus, the invention described herein makes possible the advantage of providing an active type solid-state imaging device in which electric potentials are independently set in an image sensor portion and a plurality of driving circuit portions, and driving conditions are optimized.

This and other advantages of the present invention will become apparent to those skilled in the art upon reading and understanding the following detailed description with reference to the accompanying figures.

BRIEF DESCRIPTION OF THE DRAWINGS

FIG. 22 is a cross-sectional view of a BDMIS-type pixel previously proposed by the applicant of the present application.

DESCRIPTION OF THE PREFERRED EMBODIMENTS

Hereinafter, the present invention will be described with reference to the drawings.

Figure 16:
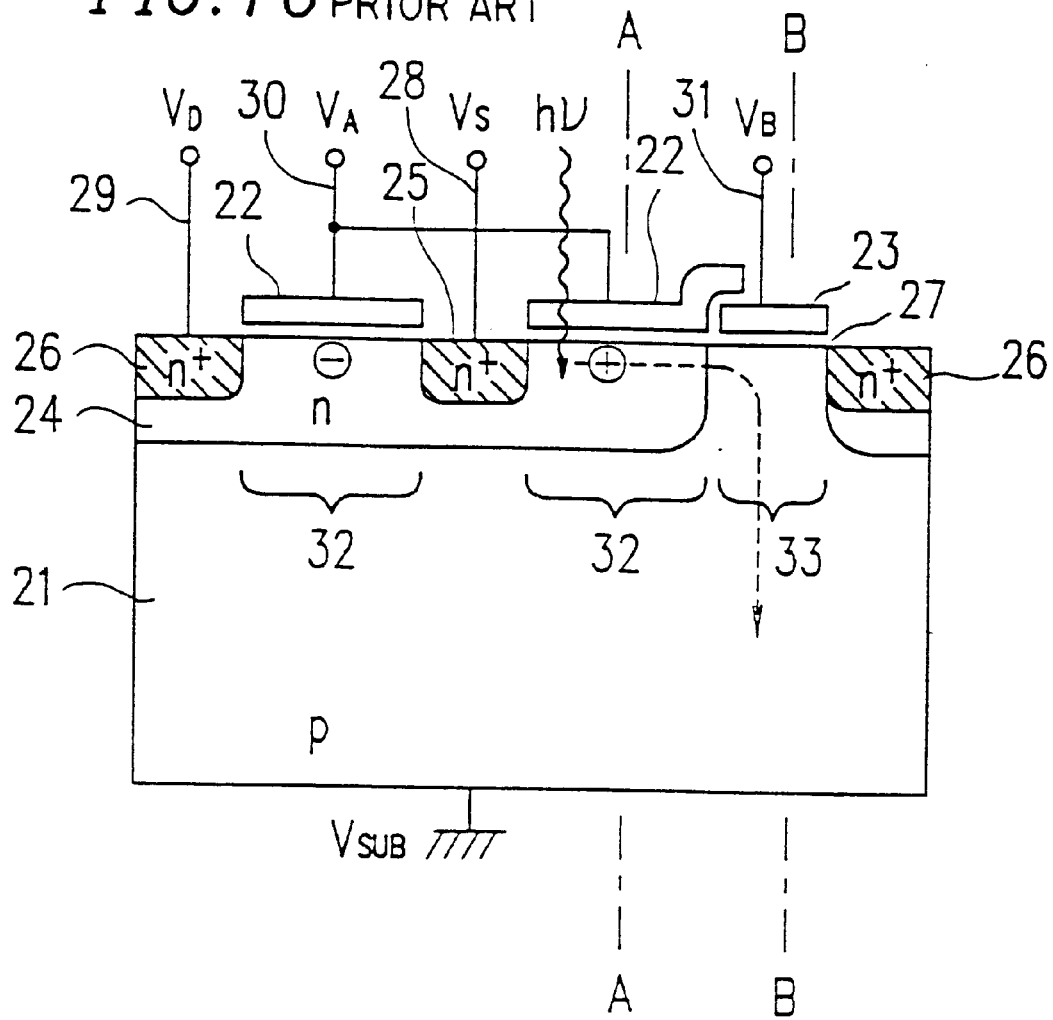
FIG. 16 is a cross-sectional view of a TGMIS-type pixel previously proposed by the applicant of the present application.
Figure 17:
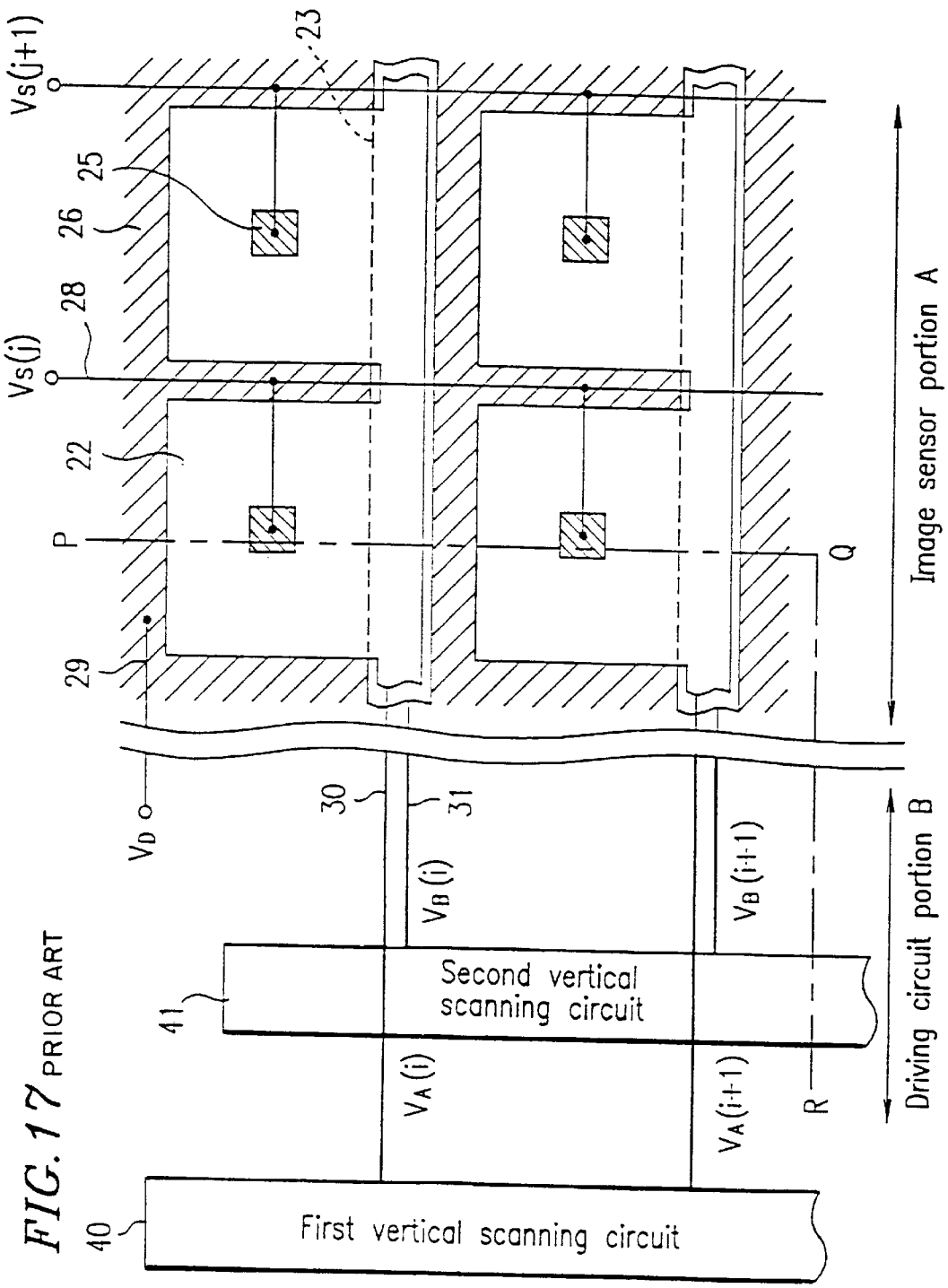
FIG. 17 is a plan view of an image sensor portion using the pixel shown in FIG. 16.
Figure 18:
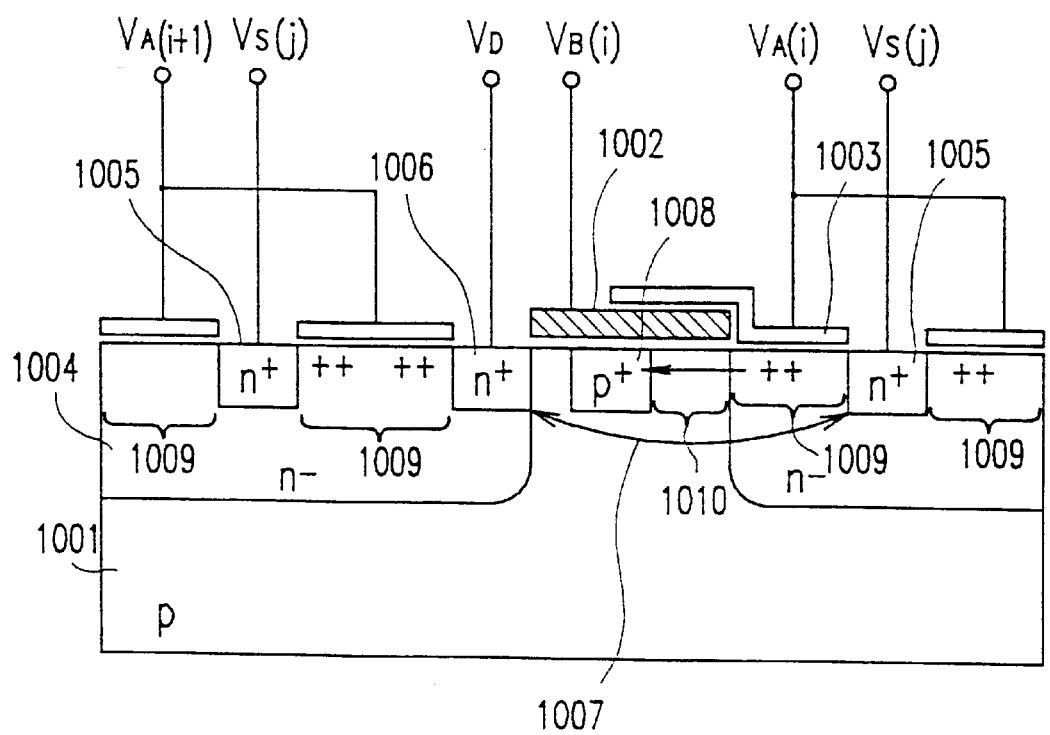
FIG. 18 is a cross-sectional view of an improved TGMIS-type pixel previously proposed by the applicant of the present application.

FIG. 18 shows improved TGMIS-type pixels of FIG. 16. An n-type semiconductor well-layer 1004 is formed on a p—type semiconductor substrate 1001. A first gate electrode 1003, which is a part of a first gate region 1009, is formed on the n-type semiconductor well-layer 1004. A second gate electrode 1002, which is a part of a second gate region 1010, is formed on the p-type semiconductor substrate 1001 so as to be adjacent to the n-type semiconductor well-layer 1004. Furthermore, a region where a potential barrier is to be formed by the second gate electrode 1002 is formed between the n-type semiconductor well-layers 1004 in the second gate region 1010. A p-type low resistance surface channel layer 1008 is formed in the region where a potential barrier is to be formed by the second gate electrode 1002 before the second gate electrode 1002 is formed. Then, $n^+$-type diffusion layers for a source 1005 and a drain 1006 of an MOS transistor using the first gate electrode 1003 as a gate are formed.

In the above-mentioned structure, light hυ incident through the first gate electrode 1003 generates an electron-hole pair by photoelectric conversion in the photoelectric conversion region of the n-type semiconductor well-layer 1004, while the electrons flow into the drain region. The holes are collected by a potential barrier formed in the middle of the semiconductor layer 1004 and a potential barrier formed under the second gate electrode 1002 and turned into the signal charges accumulated in the interface between the insulating layer and the semiconductor layer of the first gate region. The amount of the potential variation in the n-type semiconductor well-layer 1004 in accordance with the amount of the signal charges is detected as a potential variation at the source region 1005 and regarded as an output signal.

The signal charges are easily discharged along the route shown in FIG. 18 into the low resistance surface reset drain (p-type low resistance surface channel layer 1008) by lowering the potential barrier under the second gate electrode 1002. Thus, the accumulated signal charges are completely discharged (reset operation) without being affected by a potential ridge 1007 formed in the middle of the semiconductor surface of the second gate region 1010 and the p-type semiconductor substrate 1001. The potential ridge 1007 has been clarified in the prior application; therefore, its description is omitted here.

Figure 19:
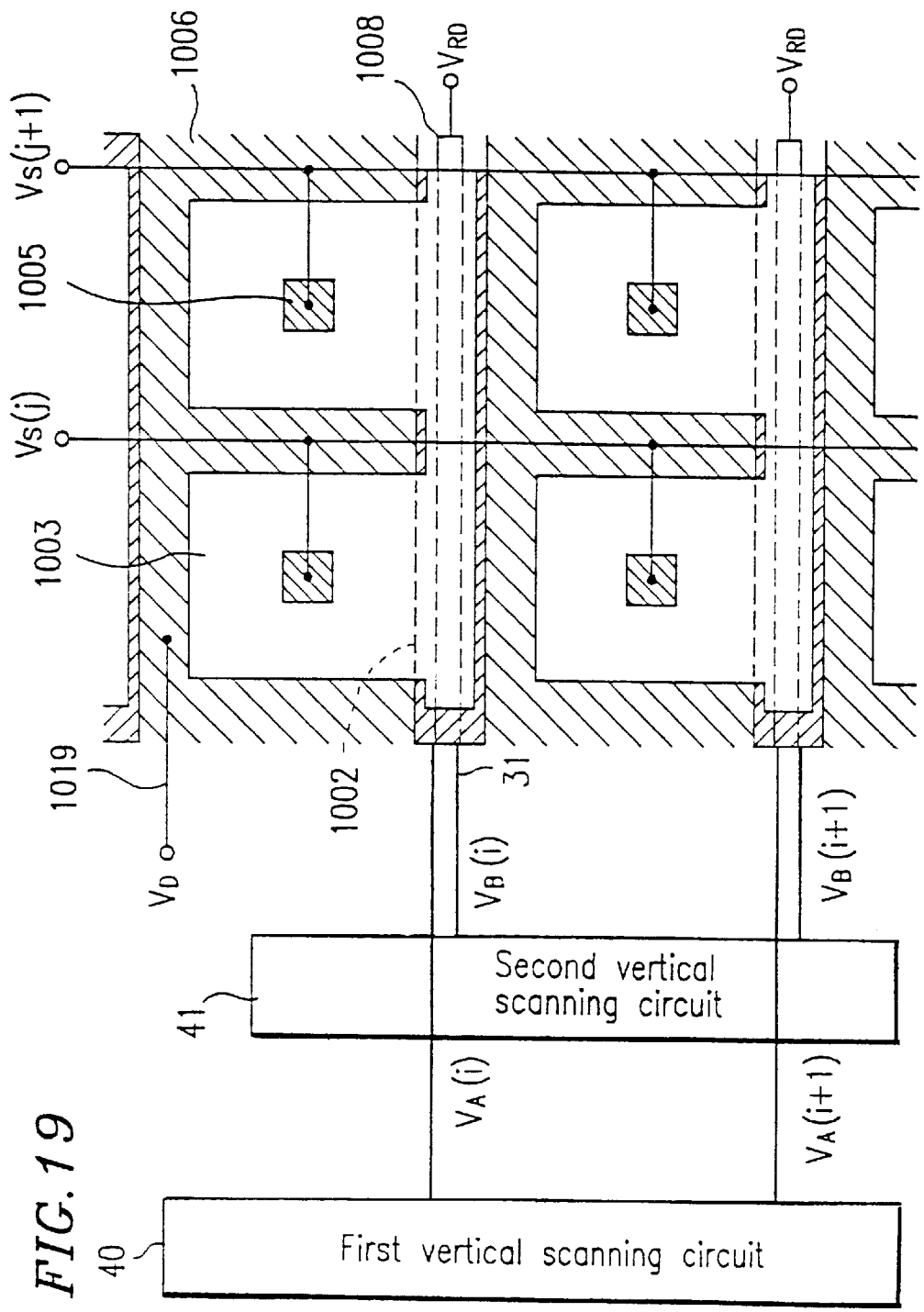
FIG. 19 is a plan view of an image sensor portion using the pixel shown in FIG. 18.

FIG. 19 shows an example of the configuration of a two-dimensional image sensor using the pixels shown in FIG. 18. First gate electrodes 1003 are connected in common to clock lines denoted by $V_A(i)$, $V_A(i+1)$, etc. in a horizontal direction in FIG. 19 and second gate electrodes 1002 are connected in common to clock lines $V_B(i)$, $V_B(i+1)$, etc. in a horizontal direction. The second gate electrodes 1002 are formed under the first gate electrodes 1003. The source regions 1005 are formed in the vicinity of the center of the n-type semiconductor well-layer 1004 under the first gate electrodes 1003 per pixel and are connected in common to signal lines denoted by $V_S(j)$ and $V_S(j+1)$. The drain regions 1006 are supplied with a voltage $V_D$ from the periphery of each pixel through drain terminals 1019. The reset drains 1008 are formed under the second gate electrodes 1002, and are connected in common in a horizontal direction and are supplied with a reset voltage $V_{RD}$.

Figure 20:
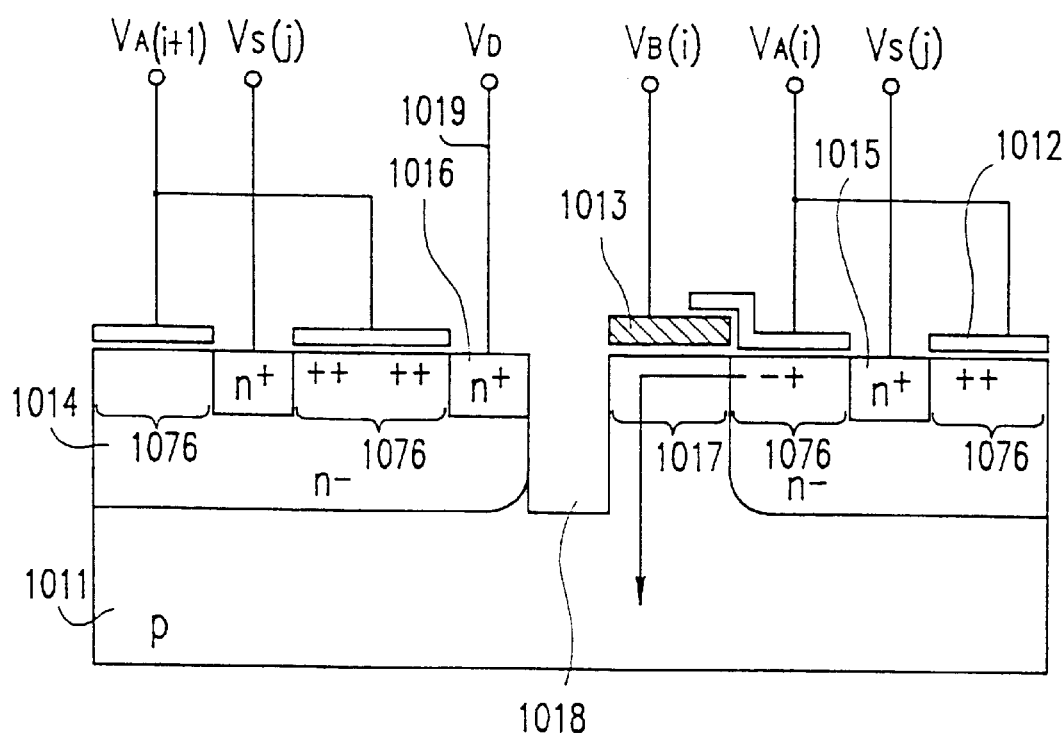
FIG. 20 is a cross-sectional view of another improved TGMIS-type pixel previously proposed by the applicant of the present application.

FIG. 20 shows another pair of improved TGMIS-type pixels.

An n-type semiconductor well-layer 1014 is formed on a p-type semiconductor substrate 1011. A first gate electrode 1012, which is a part of a first gate region 1076, is formed on the n-type semiconductor well-layer 1014, and a second gate electrode 1013, which is a part of a second gate region 1017, is formed on the p-type semiconductor substrate 1011 so as to be adjacent to the n-type semiconductor well-layer 1014. Then, $n^+$-type diffusion layers for a source 1015 and a drain 1016 of an MOS transistor using the first gate electrode 1013 as a gate are formed.

In the active type solid-state imaging device using the TGMIS type pixels shown in FIG. 16, when the width of each second gate electrode is reduced along with the increased number of pixels, a three-dimensional potential ridge is formed by an electric potential applied to the source and drain in a route through which accumulated signal charges are discharged. This prevents the complete discharge of the accumulated signal charges into the semiconductor substrate 21.

However, in the above-mentioned active type solid-state imaging device using the improved TGMIS-type pixels, a trench structure 1018 (electric field blocking portion) is formed so as to be adjacent to the second gate region 1017 for the purpose of suppressing the formation of the potential ridge. This spatially relaxes the electric field applied to the source 1015 and the drain 1016, thereby forming a channel through which the accumulated signal charges are discharged into the semiconductor substrate 1011.

The trench structure 1018 is not required to be formed in the entire region adjacent to the second gate regions 1017. The trench structures 1018 may be formed in a part of the region adjacent to the second gate regions 1017. The reason for this is as follows: if a channel can be maintained for discharging the accumulated signal charges to a part of the second gate regions 1017, the accumulated signal charges can be completely discharged.

Figure 21:
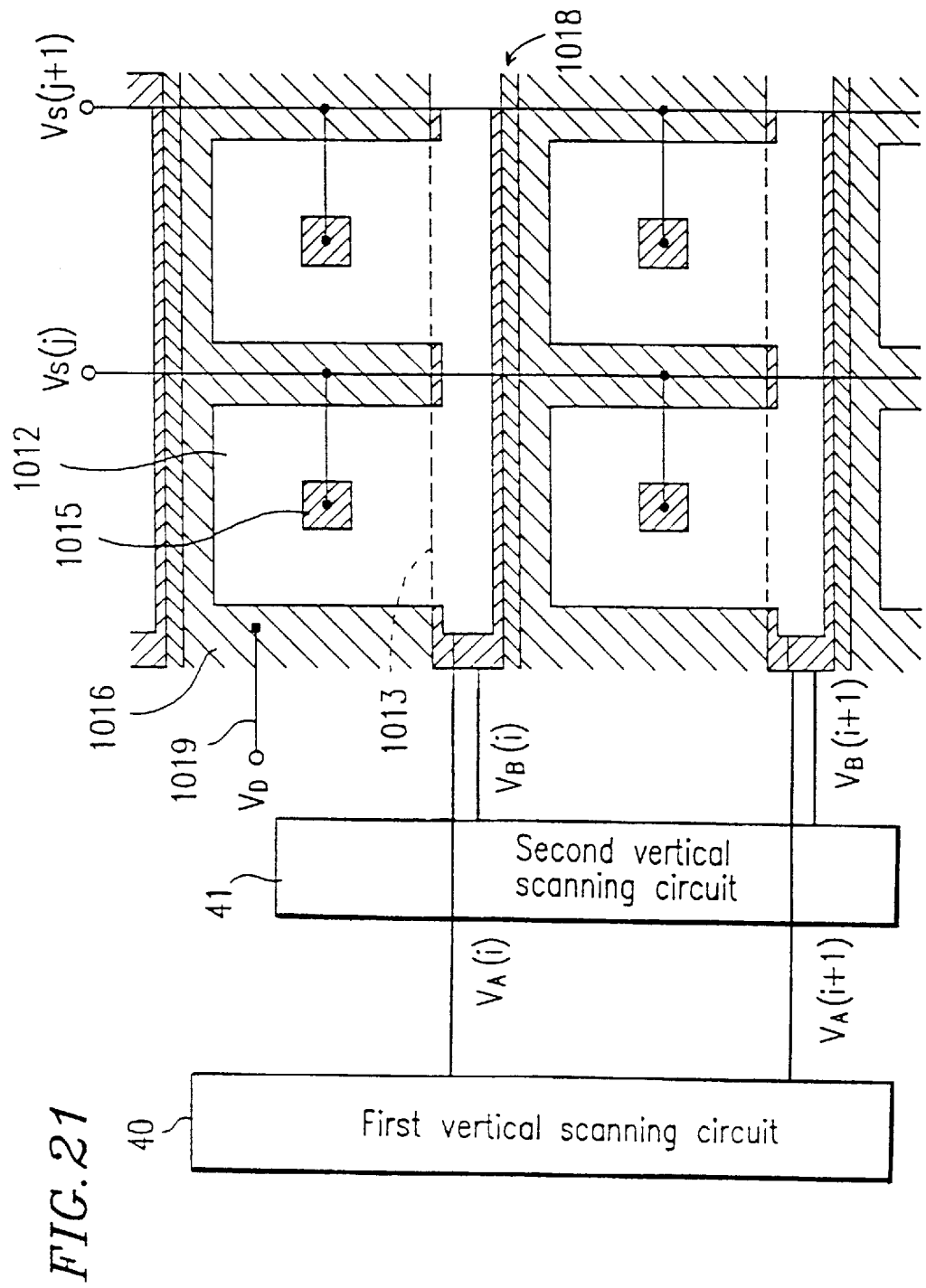
FIG. 21 is a plan view of an image sensor portion using the pixel shown in FIG. 20.

FIG. 21 shows an image sensor portion in which the pixels shown in FIG. 20 are arranged in matrix. The first gate electrodes 1012 are connected in common to a first vertical scanning circuit 40 through clock lines denoted by $V_A(i.)$, $V_A(i+1)$, etc. in a horizontal direction in FIG. 21. The second gate electrodes 1013 are connected in common to a second vertical scanning circuit 41 through clock lines denoted by $V_B(i)$, $V_B(i+1)$, etc. in a horizontal direction.

The source region 1015 is formed per pixel at the center of the first gate region 1012 of the n-type semiconductor well-layer 1014. The source regions 1015 are connected in common to signal lines denoted by $V_S(j)$, $V_S(j+1)$, etc. in a column direction of the pixels. The drain regions 1016 are formed in the periphery of each pixel as shown by hatched portions and are supplied with a voltage $V_D$ through drain terminals 1019 from the periphery thereof.

EXAMPLE 1

Figure 1:
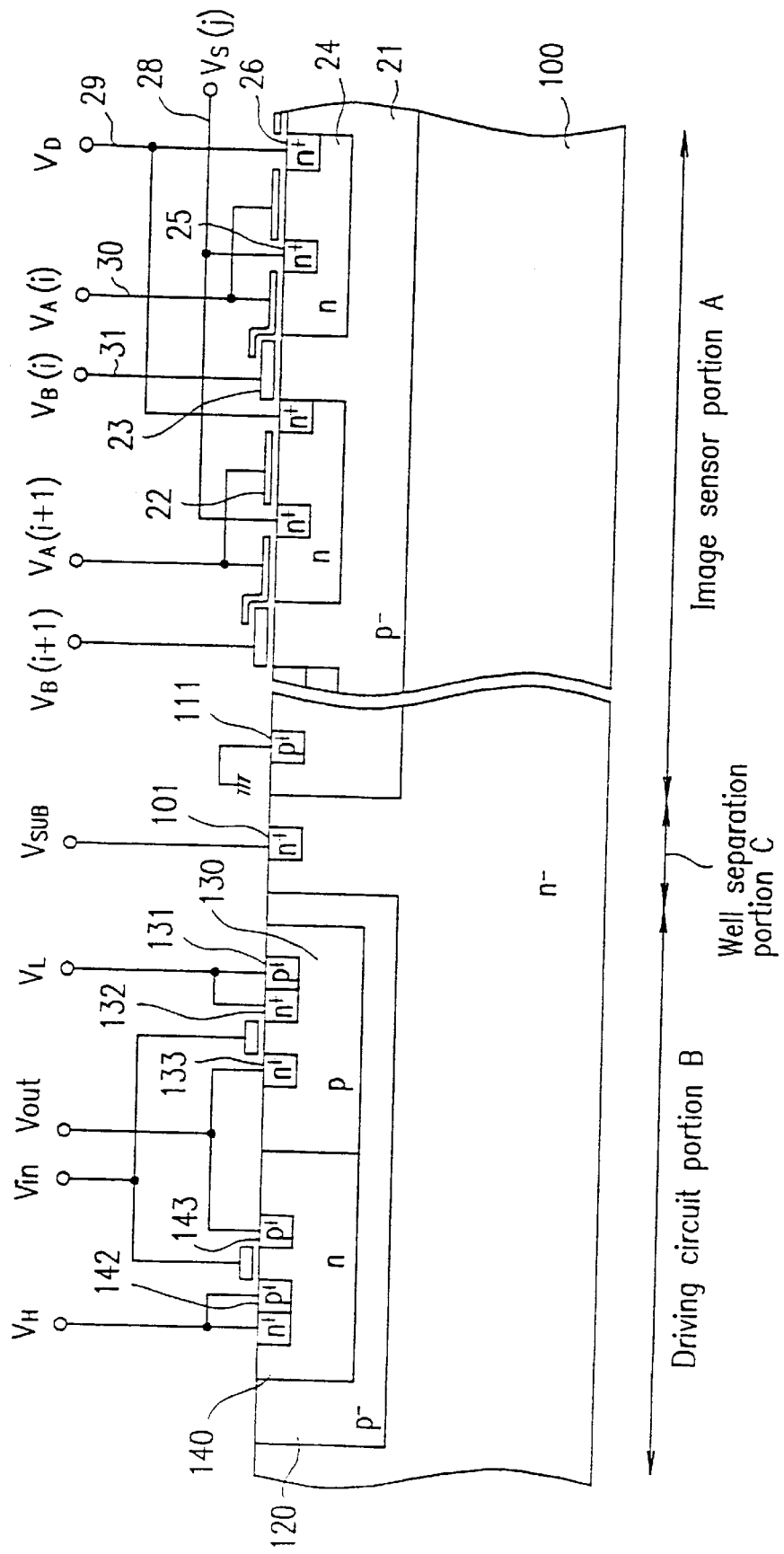
FIG. 1 is a cross-sectional view of an active type solid-state imaging device of Example 1 according to the present invention, corresponding to a cross-section taken along a line PQR in FIG. 17.

FIG. 1 shows a cross-section of an active type solid-state imaging device of Example 1. The active type solid-state imaging device of the present example has an image sensor portion A and a driving circuit portion B which works as a peripheral circuit. In the image sensor portion A, the TGMIS-type pixels shown in FIG. 16 are arranged in a matrix.

Figure 24:
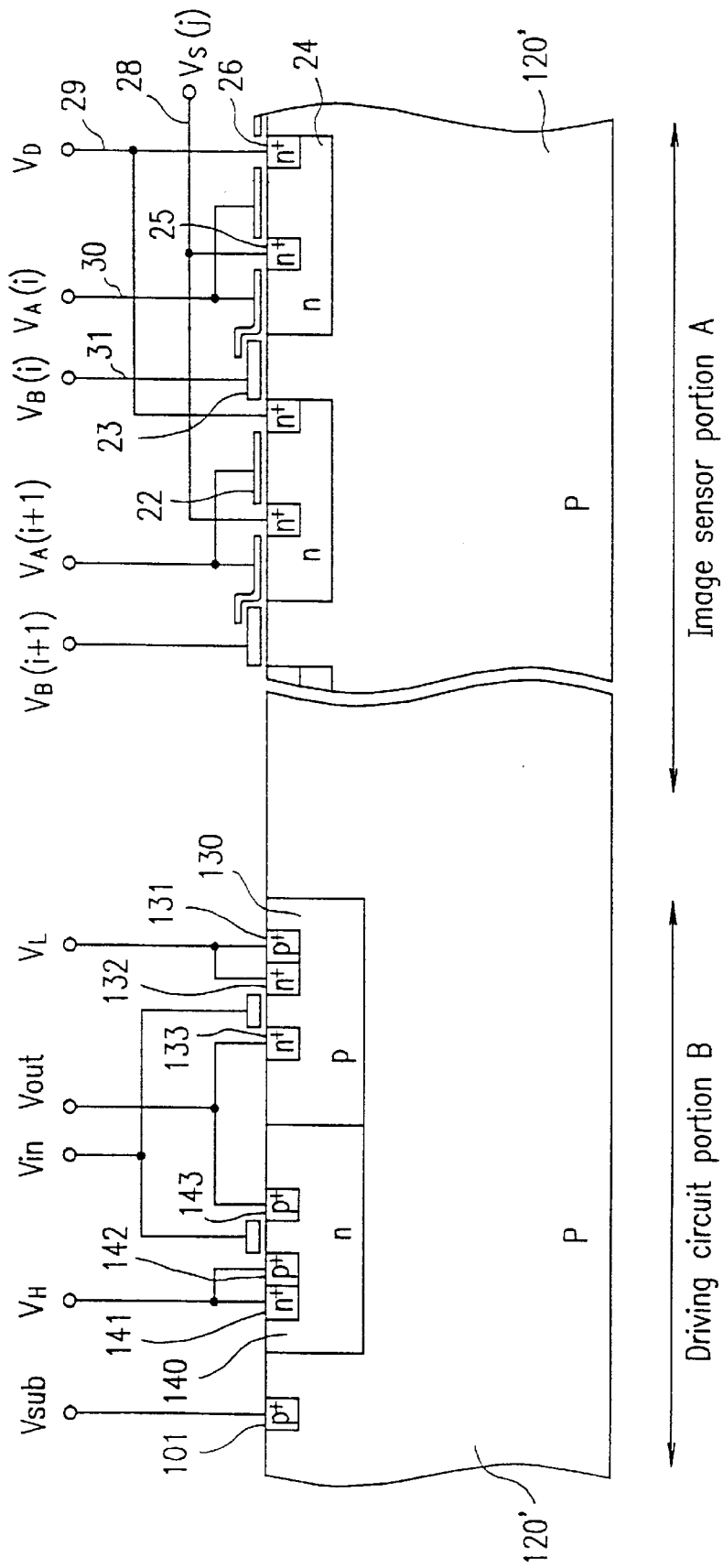
FIG. 24 is a cross-sectional view showing one conventional example of an active type solid-state imaging device using the pixels shown in FIG. 16.

The difference between the active type solid-state imaging device of Example 1 and the active type solid-state imaging device shown in FIG. 24 is that the image sensor portion A and the driving circuit portion B are separately formed in well layers 21 and 120, respectively. More specifically, the well layers 21 and 120 are formed on the surface of a substrate 100 with a well separation portion C interposed therebetween. In the well separation portion C, a substrate electric potential $V_{SUB}$ is applied to the substrate 100 through an $n^+$-region 101. As shown in FIG. 1, a p-type well layer 130 is formed in the well layer 120, and an nMOS source 132 and an nMOS drain 133 are formed in the p-type well layer 130. Furthermore, an n-type well layer 140 is formed in the well layer 120, and a pMOS source 142 and a pMOS drain 143 are formed in the n-type well layer 140.

As described above, most of the structure of the active type solid-state imaging device of Example 1 is the same as that shown in FIG. 24, except that the image sensor portion A and the driving circuit portion B are formed electrically isolated in the surface region of the substrate 100. Therefore, the components in FIG. 1 identical with those in FIG. 24 are denoted by the reference numerals identical with those in FIG. 24, and specific descriptions thereof will be omitted.

In the driving circuit portion B, a driving signal operating at an electric potential of $V_L$ to $V_H$ can be obtained. More specifically, a driving voltage can be set with respect to the driving circuit portion B independently from a reference electric potential (=ground level) of the image sensor portion A. In the active type solid-state imaging device of the present invention, various electric potentials such as an "H" level, an "L" level, and an "M" level, which is between the "H" level and the "L" level, are required to be applied to two kinds of gate electrodes 22 and 23 at the time of signal accumulation, reading, and resetting. If the image sensor portion A and the driving circuit portion B are formed in the same well layer, a voltage $V_L$ applied to the driving circuit portion B is prescribed at the reference electric potential due to the reference electric potential of the image sensor portion A, and driving cannot be conducted at a negative electric potential. This results in a disadvantageous feature that the degree of freedom of the driving conditions of the driving circuit portion B is limited. According to the present invention, the image sensor portion A and the driving circuit portion B are formed in separate well layers, so that there is no such limitation.

According to Example 1, since a voltage for driving the driving circuit portion B can be set at various levels, the driving conditions can be easily optimized. Furthermore, since the degree of freedom of a voltage can be substantially improved in the image sensor portion A, a broader dynamic range and improved detection precision can be realized.

Figure 23:
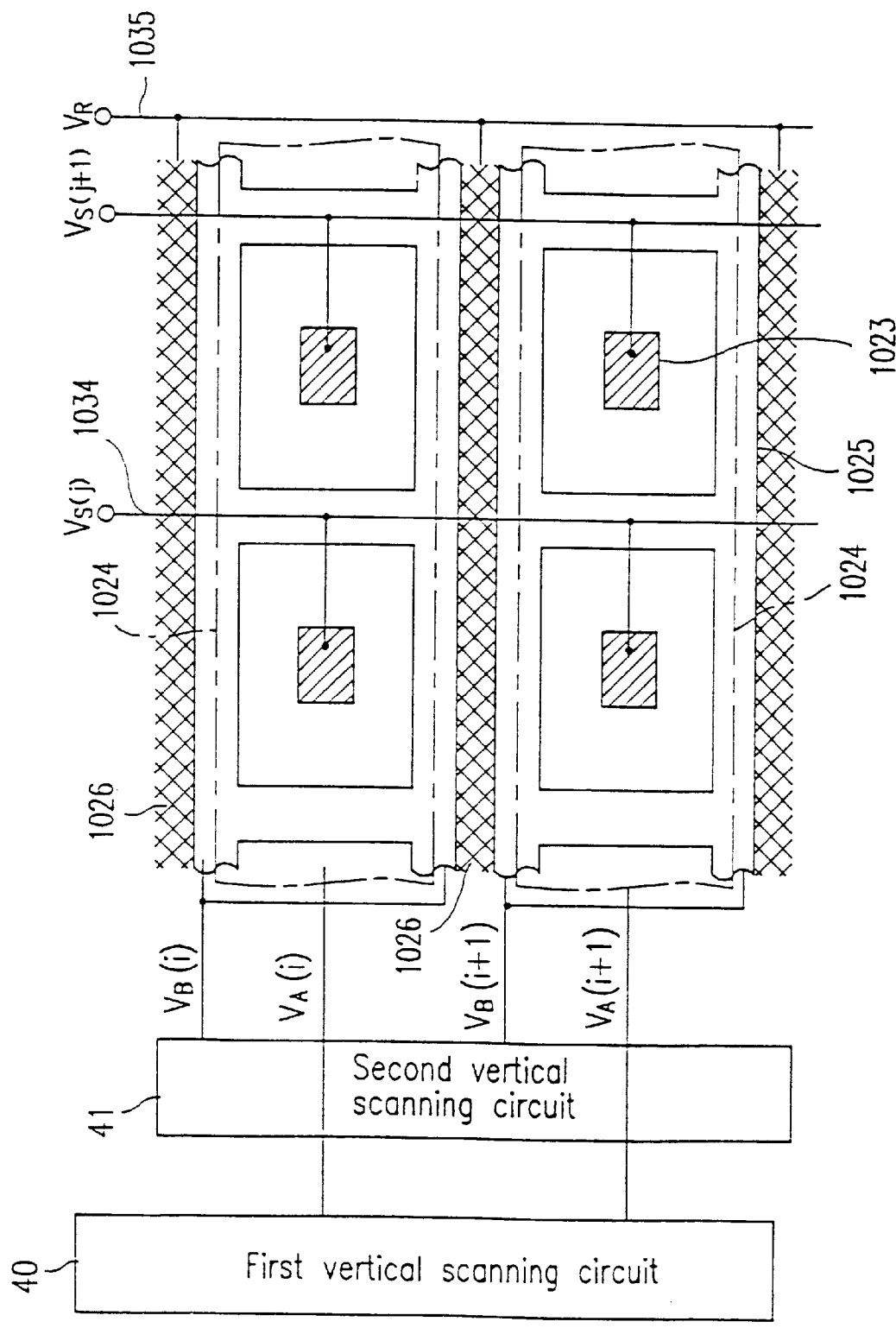
FIG. 23 is a plan view of an image sensor portion using the pixel shown in FIG. 22.

In Example 1, a second vertical scanning circuit 41 (see, for example, FIG. 23) is exemplified as the driving circuit portion B. However, a first vertical scanning circuit, a horizontal driving circuit, etc. can also be used. In the case where the voltage $V_H$ applied to the driving circuit portion B is different from the voltage $V_H$ applied to the image sensor portion A; the voltage $V_L$ applied to the driving circuit portion B is different from the voltage $V_L$ applied to the image sensor portion A; or the voltages $V_H$ and $V_L$ applied to the driving circuit portion B are respectively different from those applied to the image sensor portion A, a voltage level of each circuit can be optimized by forming the driving circuit portion B and the image sensor portion A in separate wells. This also applies to the following examples.

EXAMPLE 2

Figure 2:
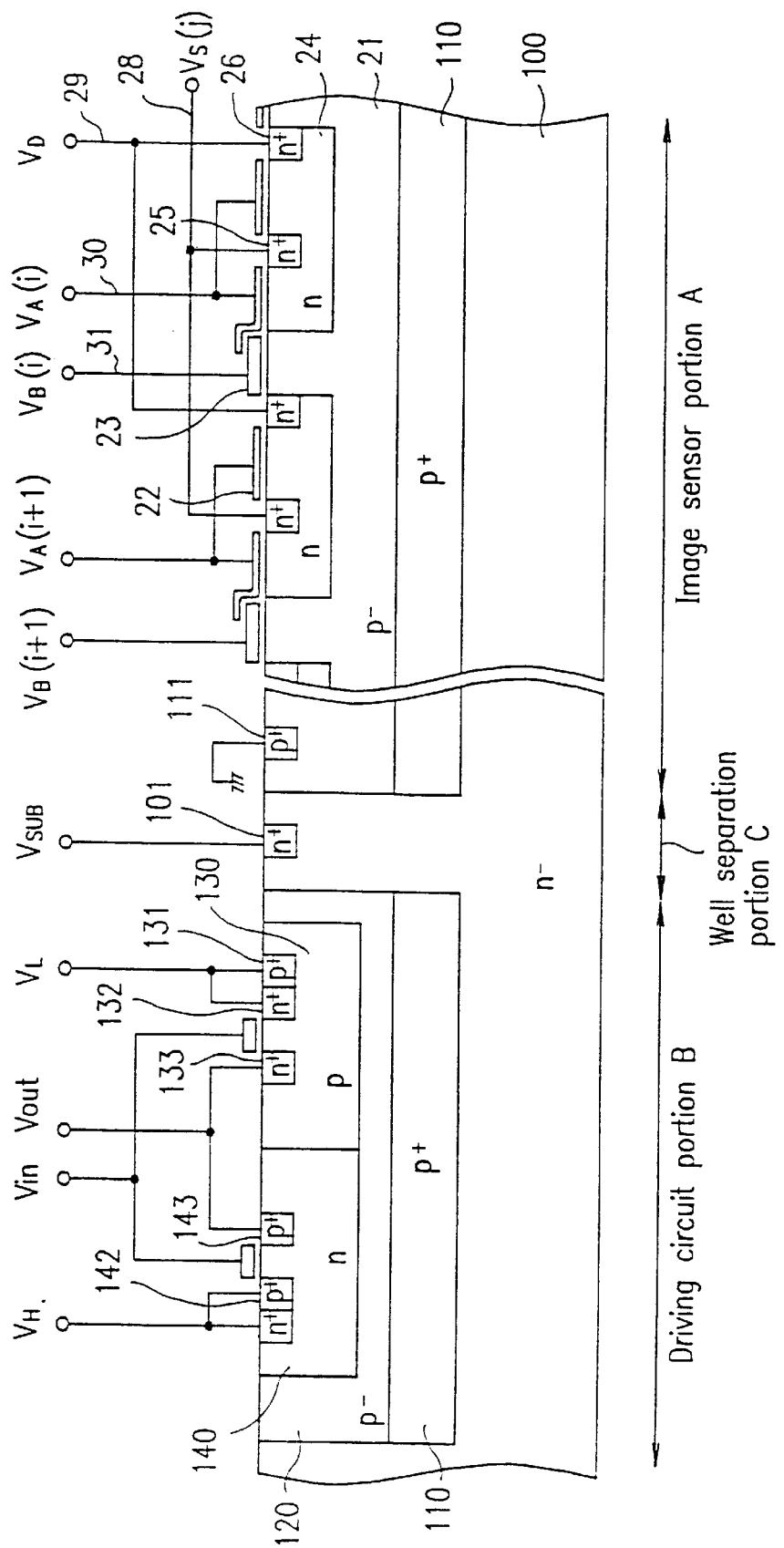
FIG. 2 is a cross-sectional view of an active type solid-state imaging device of Example 2 according to the present invention, corresponding to the cross-section taken along the line PQR in FIG. 17.

FIG. 2 shows a cross-section of an image sensor portion A and a driving circuit portion B of an active type solid-state imaging device of Example 2, in which the TGMIS-type pixels shown in FIG. 16 are arranged in a matrix. In Example 2, $p^+$-type semiconductor layers 110 are respectively formed in a region in the vicinity of a junction portion between a $p^-$-type well layer 21 and an $n^-$-type semiconductor substrate 100 and in a region in the vicinity of a junction portion between a $p^-$-type well layer 120 and the $n^-$-type semiconductor substrate 100. The $p^+$-type semiconductor layers 110 have the same conductivity type as that of the $p^-$-type well layers 21 and 120 and contain impurities in higher concentration than that of the $p^-$-type well layers 21 and 120. The other structure is the same as that of Example 1.

Figure 3:
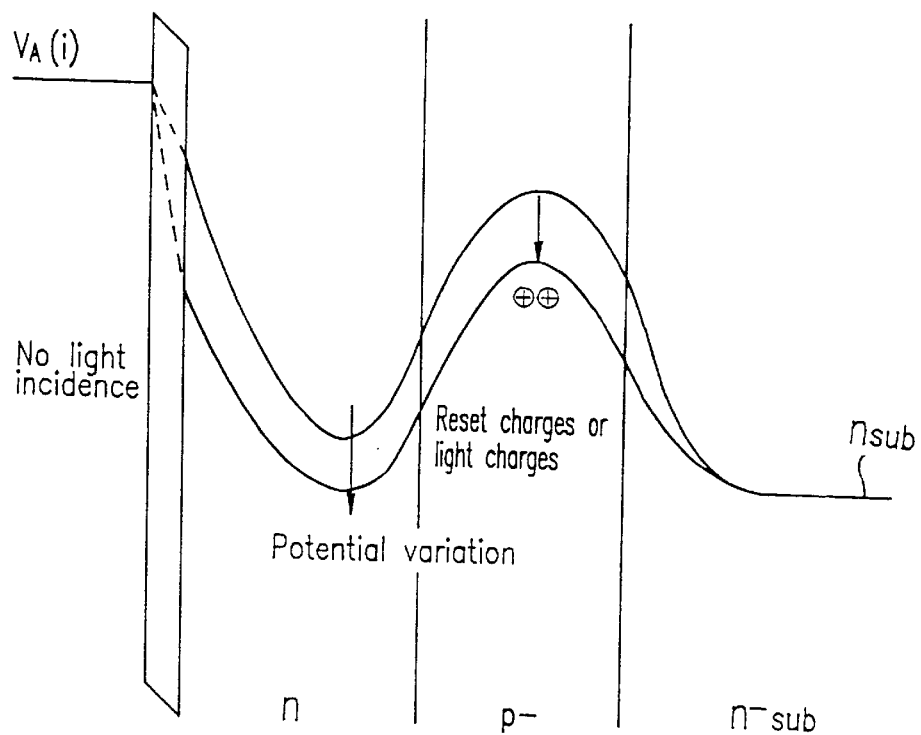
FIG. 3 is a potential distribution diagram showing problems in the case where a semiconductor layer in high concentration is not formed in a region in the vicinity of a junction portion between a well-layer and a substrate.

According to the structure of Example 2, the following effect that is not realized in Example 1 can be obtained. In the absence of the $p^+$-type semiconductor layer 110 in high concentration, the portion between the $p^-$-type well layer 21 (or 120) and the $n^-$-type semiconductor substrate 100 is completely depleted. Therefore, the charges discharged into the $n^-$-type semiconductor substrate 100 during the resetting operation, the charges generated by thermal excitation or charges generated by photoelectric conversion form a potential variation due to the depletion layer, as shown in FIG. 3. As a result, the electric potential of the $n^-$-layer 24 (or 140) varies irrespective of the driving conditions of the image sensor portion A or the driving circuit portion B. Because of this, the image sensor portion A or the driving circuit portion B may operate in an unstable manner.

Figure 4:
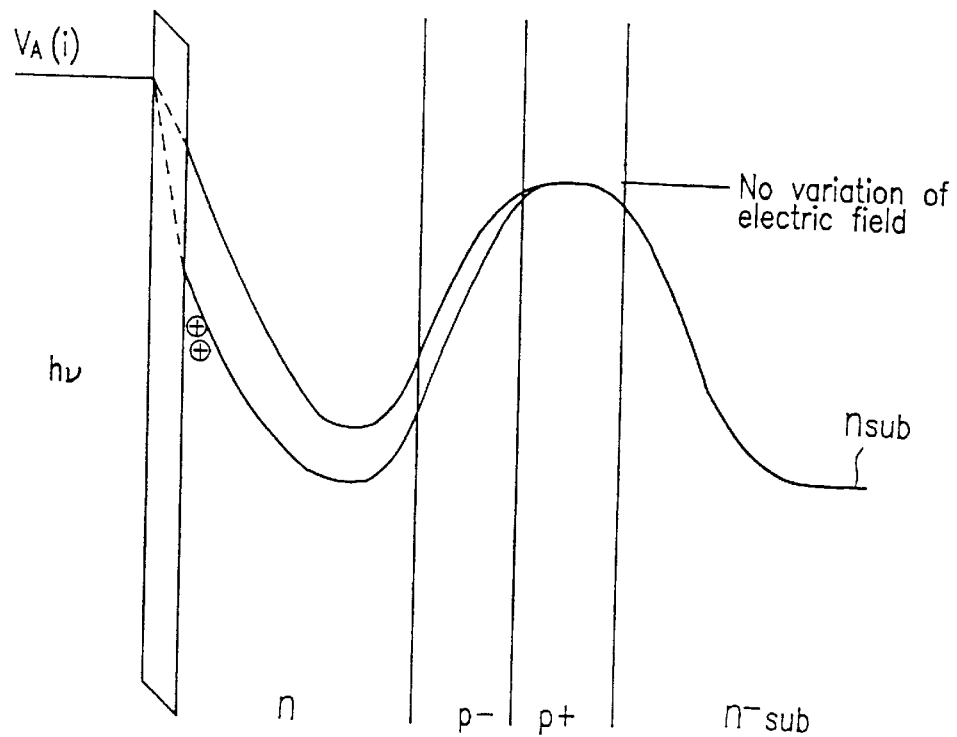
FIG. 4 shows a potential distribution diagram showing effects in the case where a semiconductor layer in high concentration is formed in a region in the vicinity of a junction portion between a well-layer and the substrate.

In contrast, when the $p^+$-type semiconductor layers 110 in high concentration are formed in the region in the vicinity of a junction portion between the $p^-$-type well layer 21 and the semiconductor substrate 100 and in the region in the vicinity of the junction portion between the $p^-$-type well layer 120 and the semiconductor substrate 100, the portion between the $p^-$-type well layer 21 (or 120) and the $n^-$-type semiconductor substrate 100 is not completely depleted. Therefore, as shown in FIG. 4, a potential is varied only by the signal charges converted from incident light by photoelectric conversion, and the electric potential of the wells in the image sensor portion A and the driving circuit portion B are uniformly fixed. This enables the image sensor portion A or the driving circuit portion B to operate stably.

Furthermore, when a high electric current rapidly flows, the $p^+$-type semiconductor layer 110 formed as described above functions so as to reduce resistance. Therefore, an unstable state such as latch-up can be avoided.

The $p^+$-type semiconductor layer 110 can be formed by high energy ion injection before or after the $p^-$-type well layers 21 and 120 are formed.

Examples of concentrations and sizes of each portion in FIG. 2 are as follows.

Concentration of the $n^-$-type semiconductor substrate 100: $2\times10^{14}$ cm$^{-3}$ Concentration of the $p^+$-type well layer 110: $3\times10^{16}$ cm$^{-3}$ Concentrations of the $p^-$-type well layers 21 and 120: $1\times10^{15}$ cm$^{-3}$ Concentration of the $n^-$-layer 24: $3\times10^{15}$ cm$^{-3}$ Concentration of the p-well 130: $5\times10^{16}$ cm$^{-3}$ Concentration of the n-well 140: $5\times10^{16}$ cm$^{-3}$ Thickness of the $p^+$-layer 110: $1\times10^{-4}$ cm Thickness of the $p^-$-type well layers 21 and 120: $2\times10^{-4}$ cm Thickness of the $n^-$-layer 24: $1\times10^{-4}$ cm Thickness of the p-well 130: $1.5\times10^{-4}$ cm Thickness of the n-well 140: $1.5\times10^{-4}$ cm

EXAMPLE 3

Figure 5:
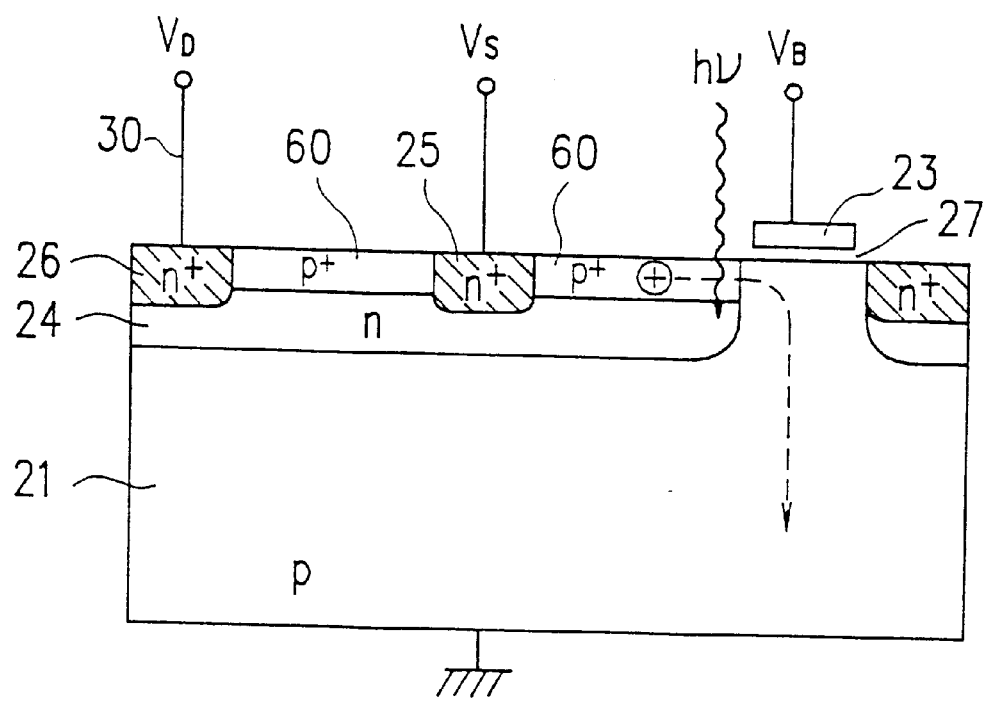
FIG. 5 is a cross-sectional view showing a pixel structure used in an active type solid-state imaging device of Example 3 according to the present invention.

FIG. 5 shows another example of a structure of pixel portion used in the active type solid-state imaging device. The pixels in Example 3 have junction gate-type FETs. In the pixels of Example 3, a high concentration $p^+$-layer 60 which is to be a junction gate is used in place of the first gate electrode 22 in FIG. 16. The electric potential of the junction gate 60 is made equal to that of the p-type semiconductor substrate 21 during the resetting operation and is floated (not tied to a fixed potential), whereby the electric potential increases in the positive direction in accordance with the accumulation of the signal charges (holes).

In FIG. 5, the components identical with those in FIG. 16 are denoted by the reference numerals identical with those in FIG. 16, and specific descriptions thereof will be omitted.

Figure 6:
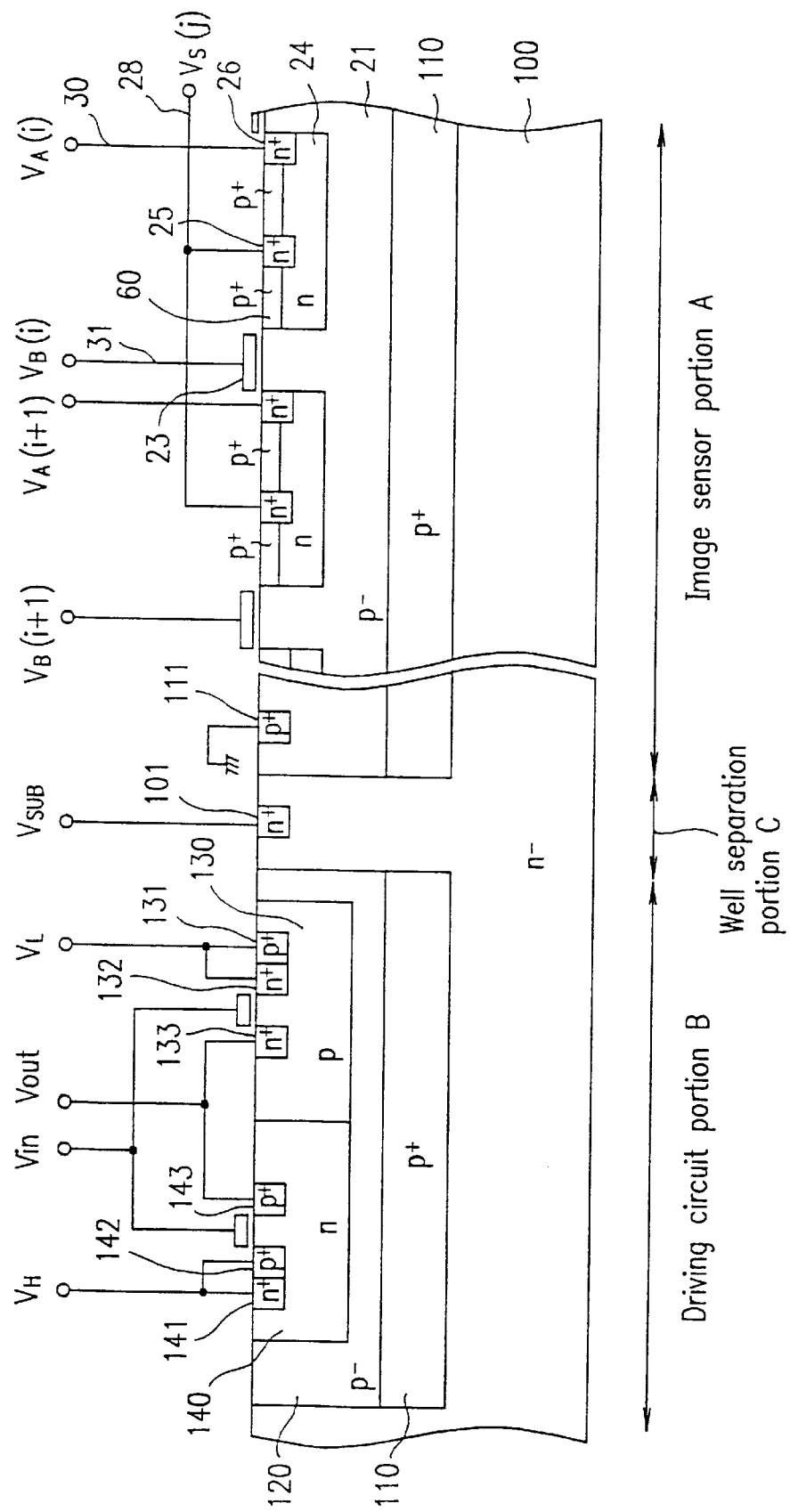
FIG. 6 is a cross-sectional view of an active type solid-state imaging device of Example 3 according to the present invention, corresponding to the cross-section taken along the line PQR in FIG. 17.

FIG. 6 shows a cross-section of an image sensor portion A and a driving circuit portion B of an active type solid-state imaging device of Example 3, in which the pixels shown in FIG. 5 are arranged in a matrix. Example 3 is different from Examples 1 and 2 in that the image sensor portion A is composed of the TGMIS-type pixels using the junction gate-type FETs. The components identical with those in Examples 1 and 2 are denoted by the reference numerals identical with those in these examples.

A well 21 is a common region of the image sensor portion A and is supplied with a ground electric potential through a $p^+$-region 111. A well 120 is a common region of the driving circuit portion B. A well 130 with a conductivity type identical with that of the well 120 and a well 140 with a conductivity type opposite to that of the well 130 are formed in the well 120. The well 120 is electrically connected to the well 130 and is supplied with an electric potential $V_L$ through a $p^+$-region 131. On the other hand, the well 140 is supplied with an electric potential $V_H$ through an $n^+$-type region 141.

Thus, in the driving circuit portion B, a driving signal operating at an electric potential of $V_L$ to $V_H$ can be obtained in the same manner as in Examples 1 and 2. That is, the driving voltage can be set in the driving circuit portion B independently from the reference electric potential (=ground level) of the image sensor portion A.

In Example 3, layers 110 having the same conductivity type as that of the wells 21 and 120 and a higher concentration than that of the wells 21 and 120 can be formed in the regions in the vicinity of the junction portions between the well 21 and the substrate 100 and between the well 120 and the substrate 100. If such a high concentration layer 110 is formed, the same effects as those in Example 2 can be obtained.

EXAMPLE 4

Figure 7:
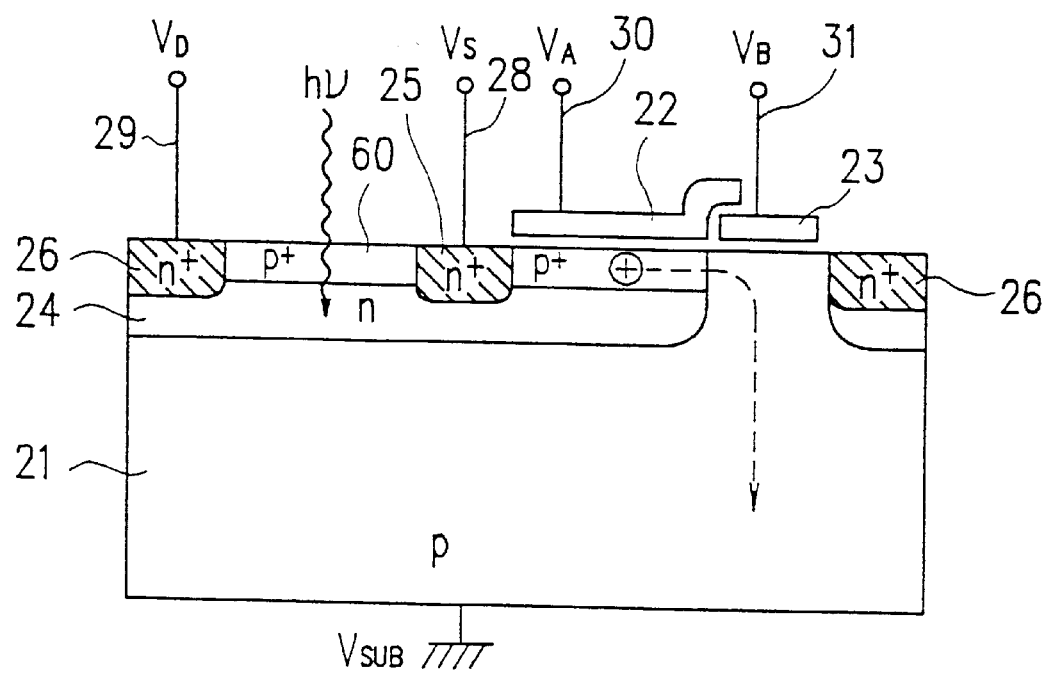
FIG. 7 is a cross-sectional view showing a pixel structure used in an active type solid-state imaging device of Example 4 according to the present invention.

FIG. 7 shows still another example of a structure of a pixel portion used in the active type solid-state imaging device. The pixels of Example 4 are of the TGMIS-type using junction gate-type FETs provided with control electrodes. The structure shown in FIG. 7 is different from that shown in FIG. 5 in that a first gate (control gate) electrode 22 is provided on a high concentration p$^+$-layer 60 which is to be a junction gate. The other structure is the same as that shown in FIG. 5. Therefore, the components in FIG. 7 identical with those in FIG. 5 are denoted by the reference numerals identical with those in FIG. 5.

The electric potential of the junction gate 60 is made equal to that of the p-substrate 21 during the resetting operation and is reset to an appropriate value during the application of an electric potential to the first gate 22. Thereafter, the electric potential increases in the positive direction in accordance with the accumulation of the signal charges (holes).

Figure 8:
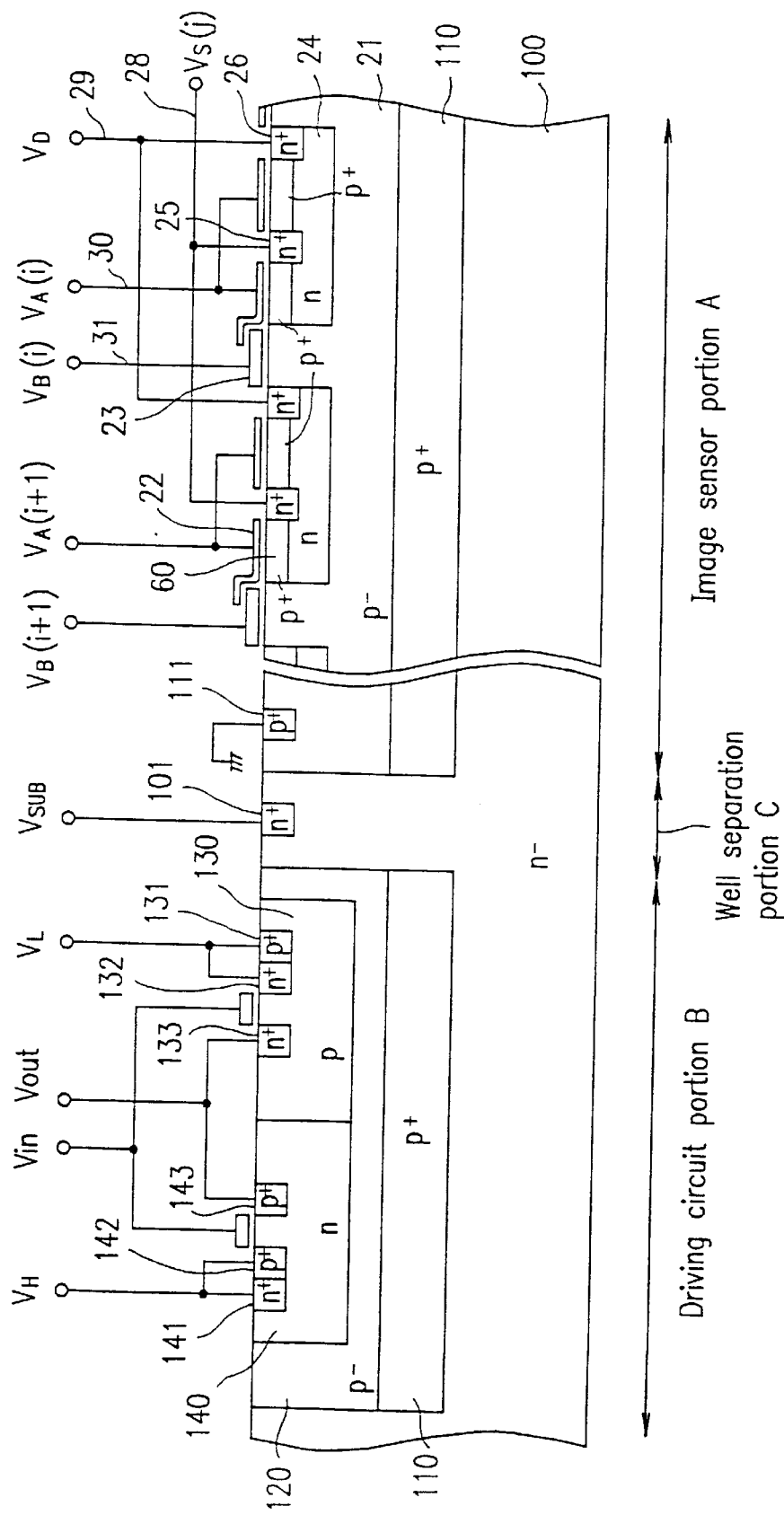
FIG. 8 is a cross-sectional view of an active type solid-state imaging device of Example 4 according to the present invention, corresponding to the cross-section taken along the line PQR in FIG. 17.

FIG. 8 shows a cross-section of an image sensor portion A and a driving circuit portion B of an active type solid-state imaging device of Example 4, in which the pixels shown in FIG. 7 are arranged in a matrix. In Example 4, the image sensor portion A is composed of the TGMIS-type pixels using junction gate-type FETs provided with control electrodes. Example 4 is different from Examples 1, 2, and 3 in this respect. The components in Example 4 identical with those in Examples 1, 2, and 3 are denoted by the reference numerals identical with those in Examples 1, 2, and 3.

In Example 4, as shown in FIG. 8, layers 110 with a conductivity type identical with that of the wells 21 and 120 and higher concentration than that of the wells 21 and 120 are formed in the regions in the vicinity of the junction portions between the well 21 and the substrate 100 and between the well 120 and the substrate 100. If such a high concentration layer 110 is formed, the same effects as those highlighted in Example 2 can be obtained.

EXAMPLE 5

Figure 9:
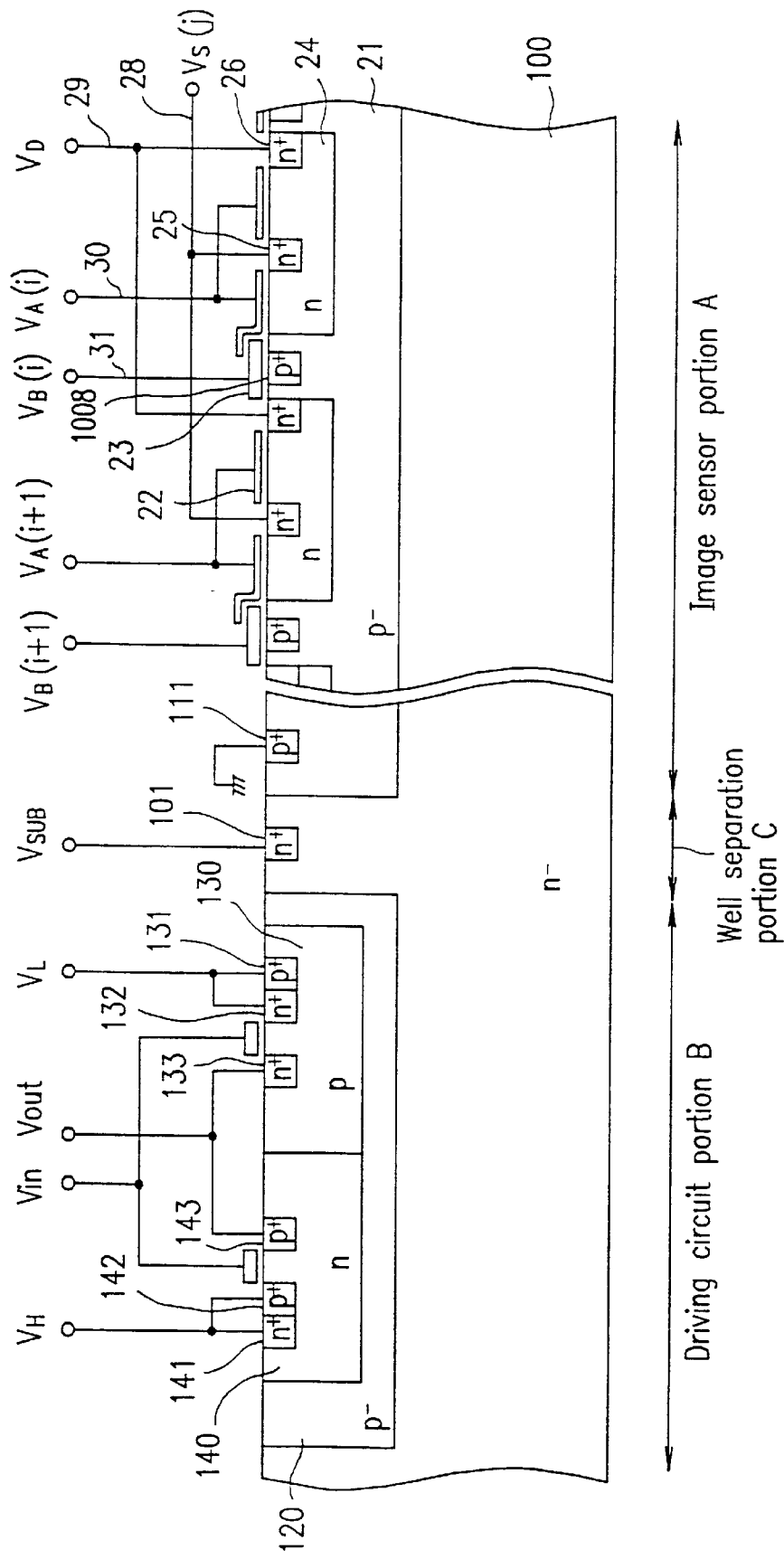
FIG. 9 is a cross-sectional view of an active type solid-state imaging device of Example 5 according to the present invention, corresponding to the cross-section taken along the line PQR in FIG. 17.

FIG. 9 shows a cross-section of an image sensor portion A and a driving circuit portion B of an active type solid-state imaging device of Example 5, in which the TGMIS-type pixels having a surface reset drain structure shown in FIG. 18 are arranged in a matrix. Example 5 is different from Example 1 in that the pixels in the image sensor portion A form a reset drain 1008 on the surface of the substrate under the second gate region. The components in FIG. 9 identical with those in FIG. 1 are denoted by the reference numerals identical with those in FIG. 9.

A well 21 is a common region of the image sensor portion A and is supplied with a ground electric potential through a p$^+$-region 111. A well 120 is a common region of the driving circuit portion B. A well 130 with a conductivity type identical with that of the well 120 and a well 140 with a conductivity type opposite to that of the well 130 are formed in the well 120. The well 120 is electrically connected to the well 130 and is supplied with an electric potential $V_L$ through a p$^+$-region 131. On the other hand, the well 140 is supplied with an electric potential $V_H$ through an n$^+$-region 141.

Thus, in the driving circuit portion B, a driving signal operating at an electric potential of $V_L$ to $V_H$ can be obtained in the same manner as in Examples 1 and 2. That is, the driving voltage can be set in the driving circuit portion B independently from the reference electric potential (=ground level) of the image sensor portion A.

In Example 5, layers 110 with the same conductivity type as that of the wells 21 and 120 and higher concentration than that of the wells 21 and 120 can be formed in the regions in the vicinity of the junction portions between the well 21 and the substrate 100 and between the well 120 and the substrate 100. If such a high concentration layer 110 is formed, the same effects as those in Example 2 can be obtained.

EXAMPLE 6

Figure 10:
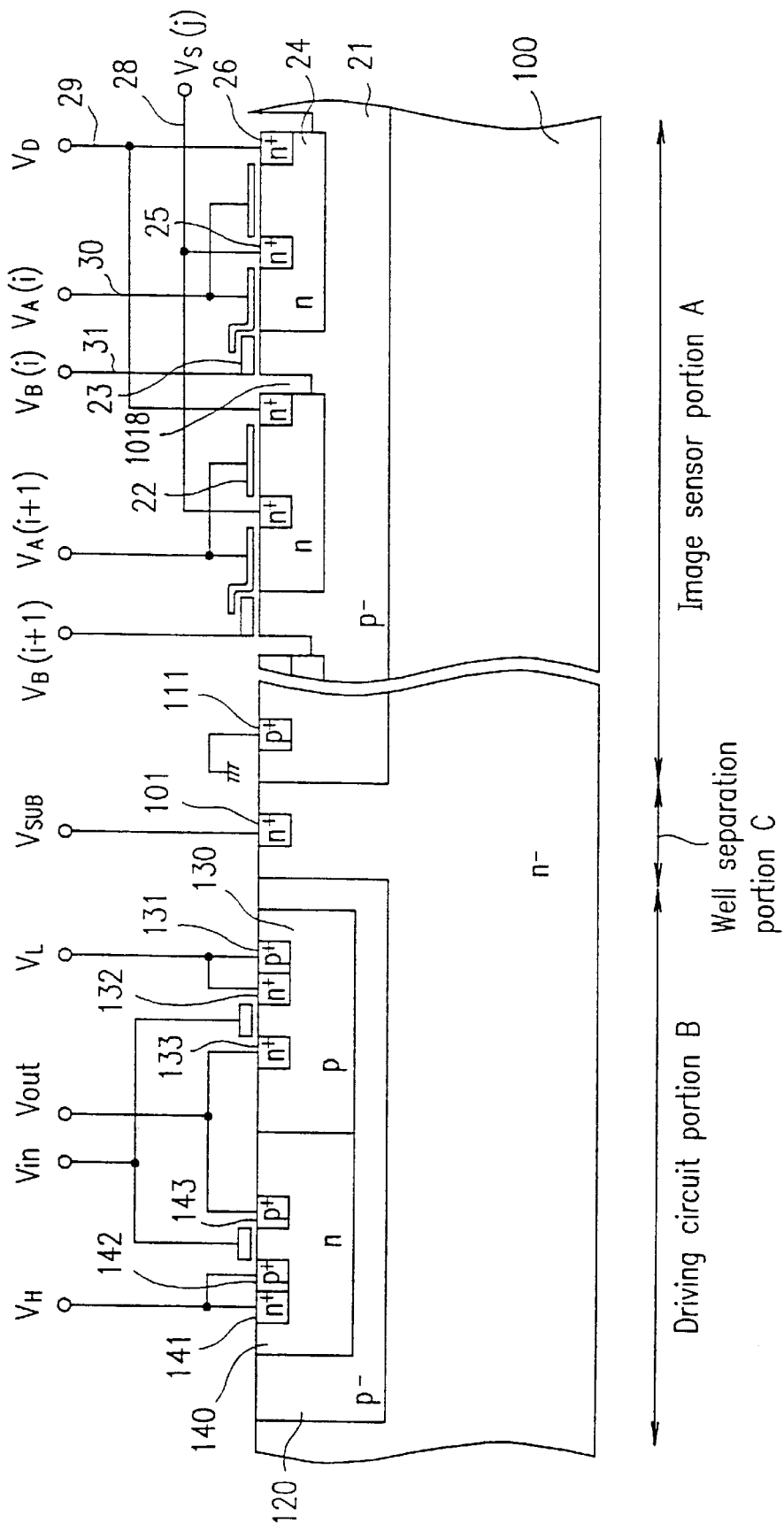
FIG. 10 is a cross-sectional view of an active type solid-state imaging device of Example 6 according to the present invention, corresponding to the cross-section taken along the line PQR in FIG. 17.

FIG. 10 shows a cross-section of an image sensor portion A and a driving circuit portion B of an active type solid-state imaging device of Example 6, in which the TGMIS-type pixels having a trench structure as shown in FIG. 20 are arranged in a matrix. Example 6 is different from Example 1 in that a trench structure 1018 is formed on a part of the surface of the substrate in the vicinity of a second gate region 23 of the pixels of the image sensor portion A. The components in Example 6 identical with those in Example 1 are denoted by the reference numerals identical with those in Example 1.

A well 21 is a common region of the image sensor portion A and is supplied with a ground electric potential through a p$^+$-region 111. A well 120 is a common region of the driving circuit portion B. A well 130 with a conductivity type identical with that of the well 120 and a well 140 with a conductivity type opposite to that of the well 130 are formed in the well 120. The well 120 is electrically connected to the well 130 and is supplied with an electric potential $V_L$ through a p$^+$-region 131. On the other hand, the well 140 is supplied with an electric potential $V_H$ through an n$^+$-region 141.

Thus, in the driving circuit portion B, a driving signal operating at an electric potential of $V_L$ to $V_H$ can be obtained in the same manner as in Examples 1 and 2. That is, the driving voltage can be set in the driving circuit portion B independently from the reference electric potential (=ground level) of the image sensor portion A.

In Example 6, layers 110 with the same conductivity type as that of the wells 21 and 120 and higher concentration than that of the wells 21 and 120 can be formed in the regions in the vicinity of the junction portions between the well 21 and the substrate 100 and between the well 120 and the substrate 100. If such a high concentration layer 110 is formed, the same effects as those in Example 2 can be obtained.

EXAMPLE 7

Figure 11:
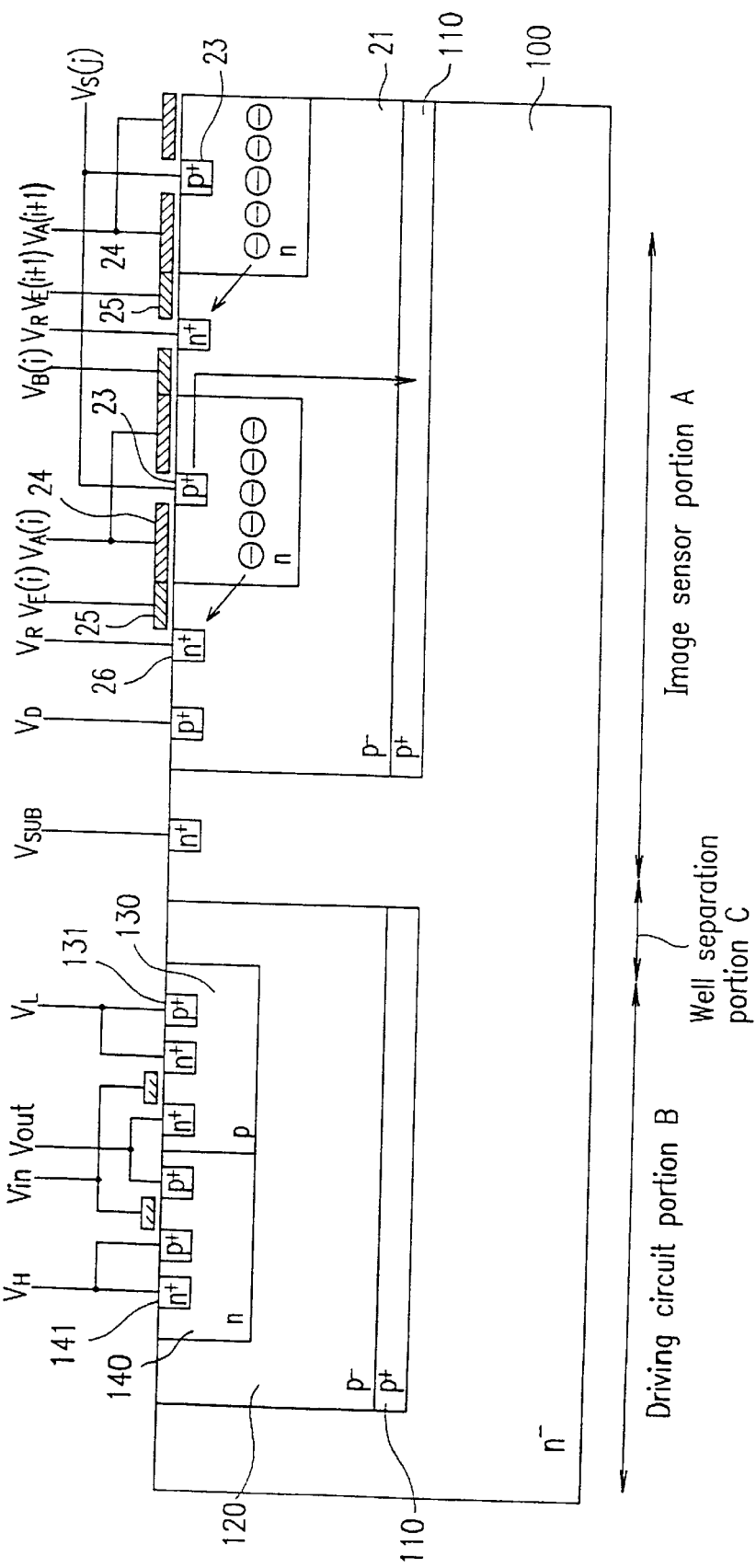
FIG. 11 is a cross-sectional view of an active type solid-state imaging device of Example 7 according to the present invention, corresponding to the cross-section taken along the line PQR in FIG. 17.
Figure 12A:
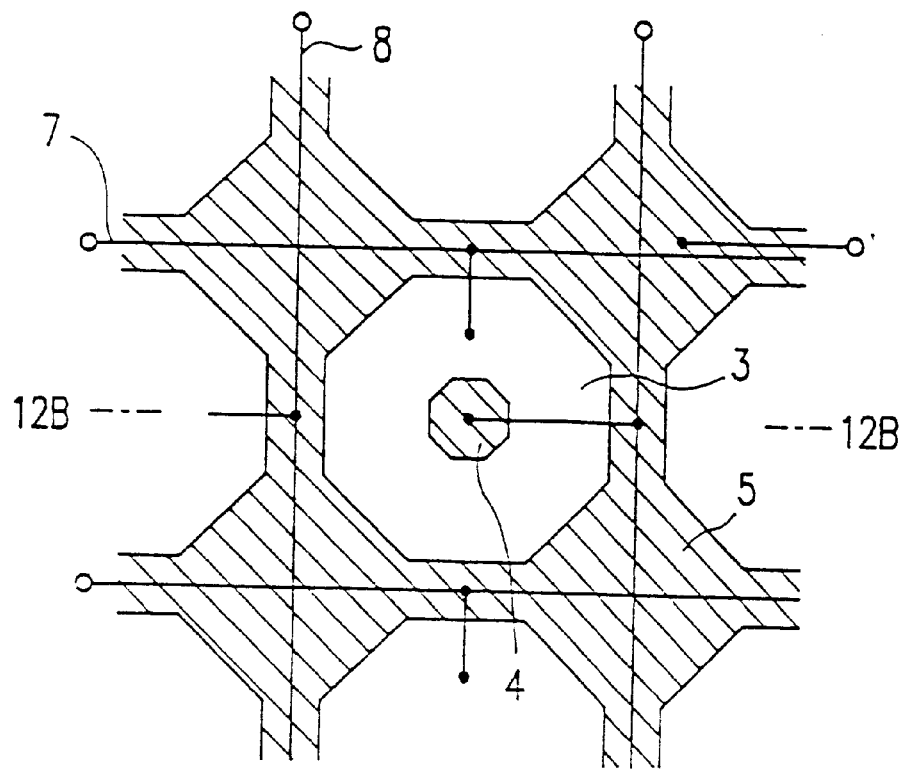
FIG. 12A is a plan view of one pixel of a conventional CMD-type solid-state imaging device.
Figure 12B:
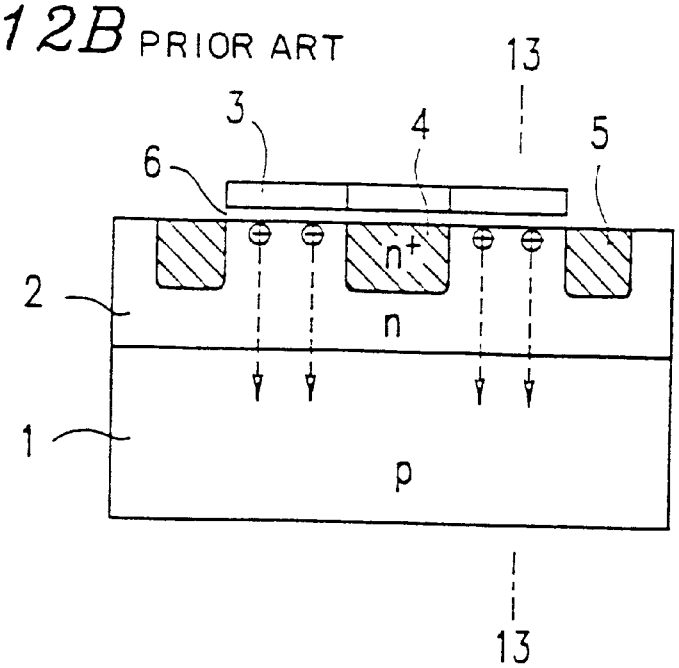
FIG. 12B is a cross-sectional view taken along a line 12B—12B in FIG. 12A.
Figure 13:
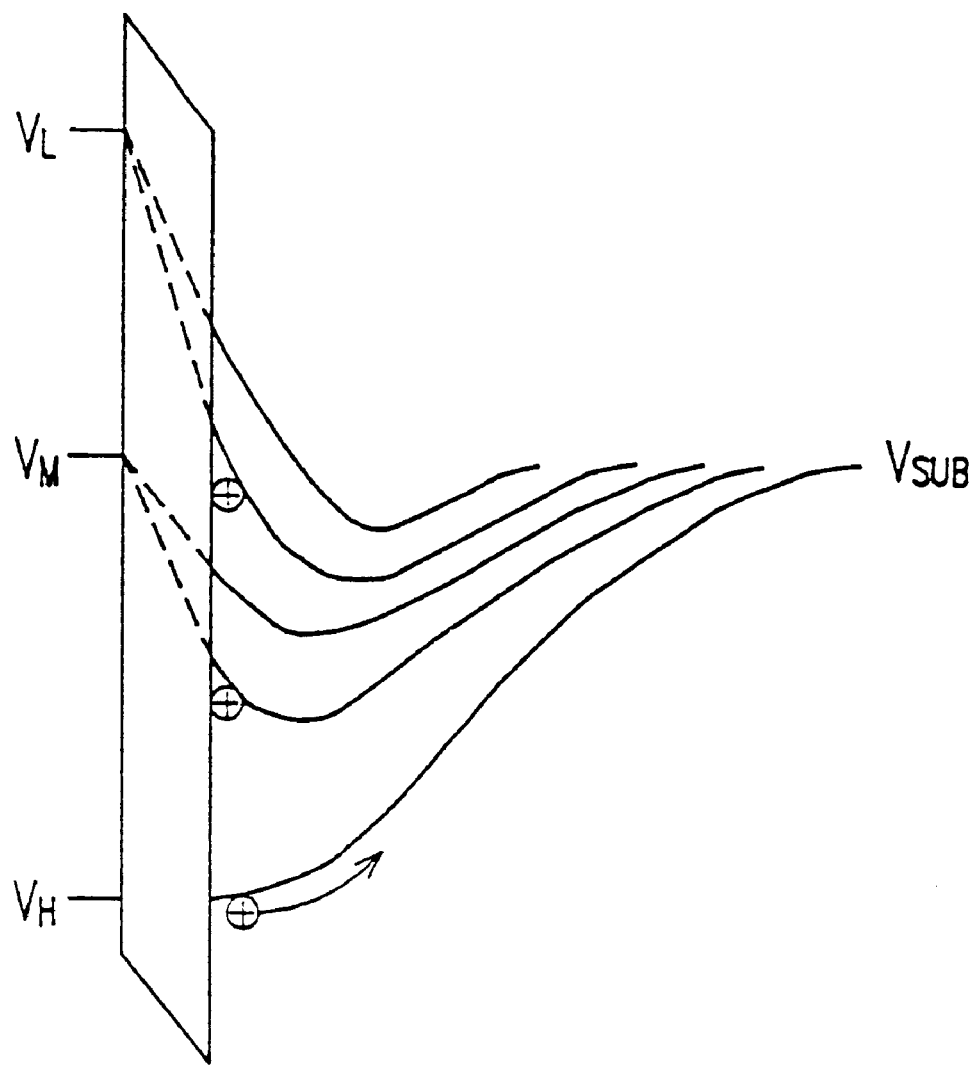
FIG. 13 shows a potential distribution of the imaging device shown in FIGS. 12A and 12B.
Figure 14A:
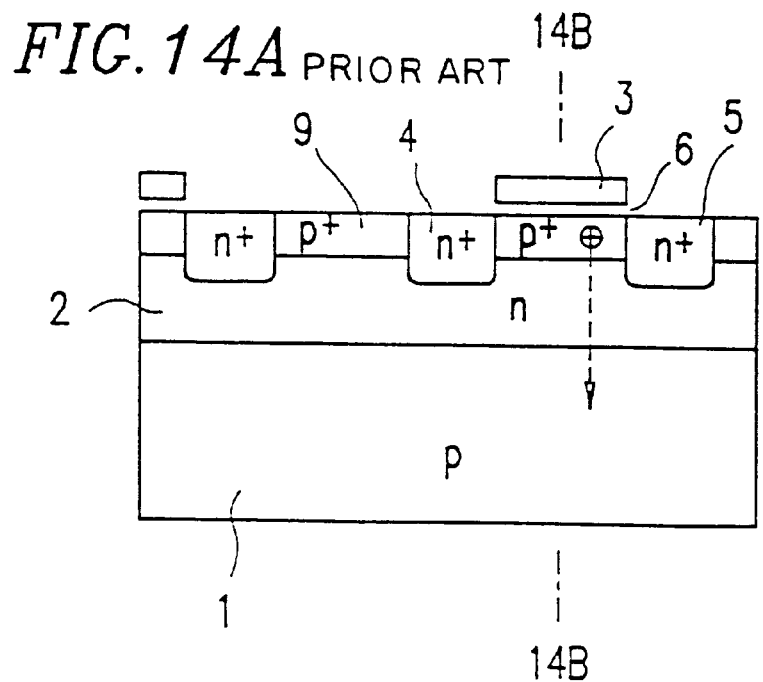
FIG. 14A is a cross-sectional view of a conventional FGA-type solid-state imaging device.
Figure 14B:
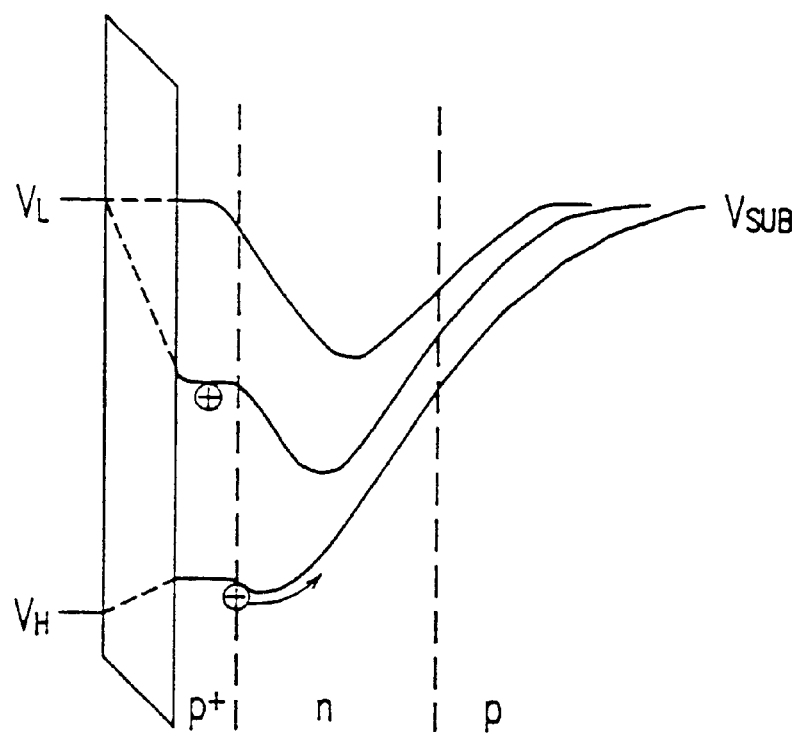
FIG. 14B shows a potential distribution of the imaging device shown in FIG. 14A.
Figure 15A:
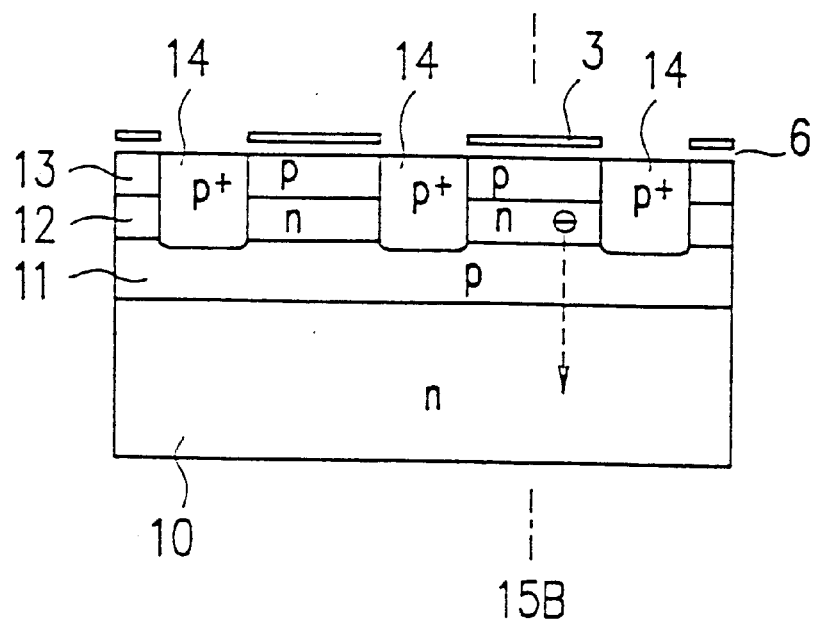
FIG. 15A is a cross-sectional view of a conventional BCMD-type solid-state imaging device.
Figure 15B:
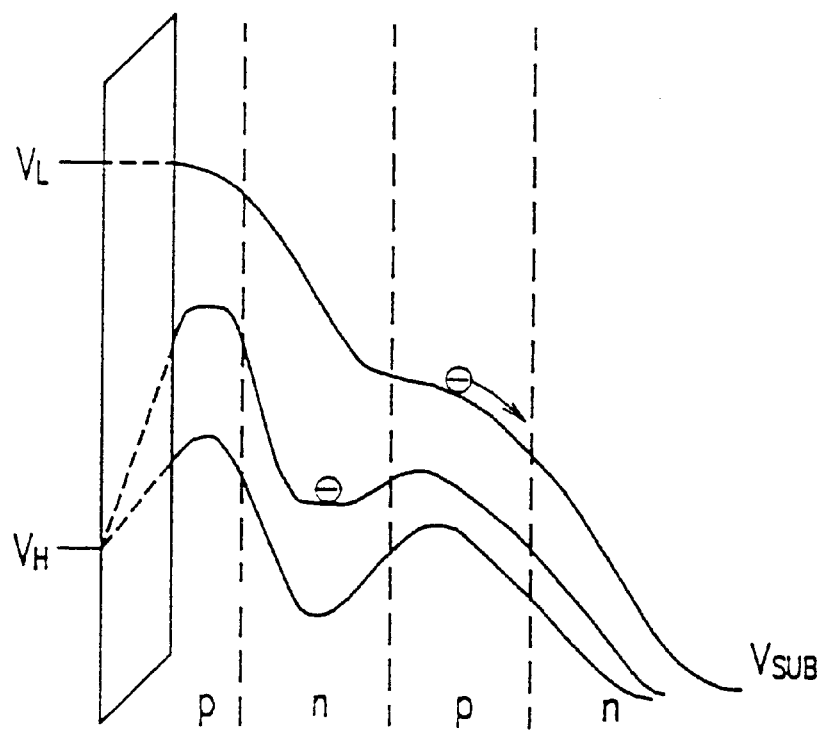
FIG. 15B shows a potential distribution of the imaging device shown in FIG. 15A.
Figure 22:
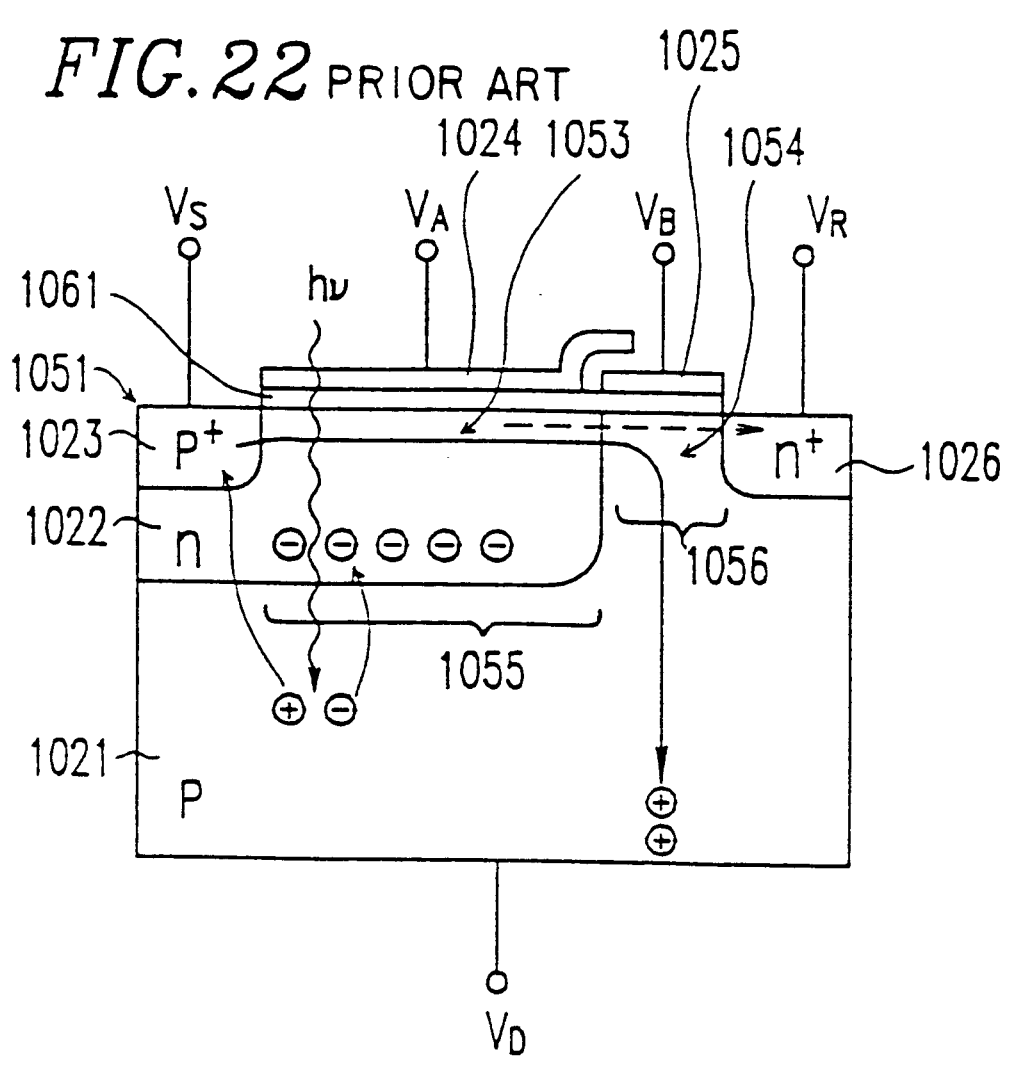

FIG. 11 shows a cross-section of an image sensor portion A and a driving circuit portion B of an active type solid-state imaging device of Example 7, in which the BDMIS-type pixels shown in FIG. 22 are arranged in a matrix. Example 7 is different from Example 5 in that the pixels in the image sensor portion A use the substrate 100 as a drain. The components in Example 7 identical with those in Example 5 are denoted by the reference numerals identical with those in Example 5.

A well 21 is a common region of the image sensor portion A and is supplied with a ground electric potential through a p$^+$-region 111. A well 120 is a common region of the driving circuit portion B. A well 130 with a conductivity type identical with that of the well 120 and a well 140 with a conductivity type opposite to that of the well 120 are formed in the well 120. The well 120 is electrically connected to the well 130 and is supplied with an electric potential $V_L$ through a p$^+$-region 131. On the other hand, the well 140 is supplied with an electric potential $V_H$ through an n$^+$-region 141.

Thus, in the driving circuit portion B, a driving signal operating at an electric potential of $V_L$ to $V_H$ can be obtained in the same manner as in Examples 1 and 2. That is, the driving voltage can be set in the driving circuit portion B independently from the reference electric potential (=ground level) of the image sensor portion A.

In Example 7, layers 110 with the same conductivity type as that of the wells 21 and 120 and a higher concentration than that of the wells 21 and 120 can be formed in the regions in the vicinity of the junction portions between the well 21 and the substrate 100 and between the well 120 and the substrate 100. If such a high concentration layer 110 is formed, the same effects as those in Example 2 can be obtained.

As described above, in the active type solid-state imaging device of the present invention, the image sensor portion and the driving circuit portion which drives the image sensor portion or conducts a signal processing are formed in separate semiconductor regions in the identical semiconductor substrate. Therefore, the electric potential in the respective regions can be set independently. This allows a driving voltage to be variable in the driving circuit portion, whereby the driving voltage can be optimized. Furthermore, the degree of freedom of a voltage can be substantially enhanced in the signal processing portion, so that a broader dynamic range is obtained. This can contribute to the achievement of an active type solid-state imaging device with outstanding pixel characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active type solid-state imaging device, comprising:
   an image sensor portion having an active type photoelectric conversion element, formed in a first semiconductor layer of a second conductivity type in a semiconductor substrate of a first conductivity type; and
   a driving circuit for driving the image sensor portion, formed in a second semiconductor layer of the second conductivity type in the semiconductor substrate,
   wherein the active type photoelectric conversion element includes:
   a transistor which accumulates signal charges generated from incident light on a surface of the first semiconductor layer and outputs changes in an electric signal in accordance with the accumulated signal charges; and
   a gate region provided adjacent to the transistor, which includes: a part of the first semiconductor layer; a first insulating film formed on the part of the first semiconductor layer; and a gate electrode provided on the first insulating film, and which transfers the accumulated signal charges from the surface of the first semiconductor layer to an inside portion of the first semiconductor layer based on a voltage applied to the gate electrode, and
   the first semiconductor layer and the second semiconductor layer are formed so as to be separated from each other on the semiconductor substrate.

2. An active type solid-state imaging device, comprising:
   an image sensor portion having an active type photoelectric conversion element, formed in a first semiconductor layer of a second conductivity type in a semiconductor substrate of a first conductivity type; and
   a driving circuit for driving the image sensor portion, formed in a second semiconductor layer of the second conductivity type in the semiconductor substrate,
   wherein the active type photoelectric conversion element includes:
   a transistor including: a first gate region having a portion of a surface region of the first semiconductor layer in which signal charges generated by photoelectric conversion are accumulated and a first gate electrode formed on the surface region of the first semiconductor layer; and a source and a drain made of layers having an impurity concentration higher than an impurity concentration of the first semiconductor layer, formed on the surface of the first semiconductor layer; and
   a charge discharging portion including: a second gate region having a portion of the surface region of the first semiconductor layer adjacent to the first gate region and a second gate electrode formed on the surface region of the first semiconductor layer with an insulating layer interposed therebetween so as to be adjacent to the first gate electrode; and a second drain for discharging charges made of a layer having an impurity concentration higher than the impurity concentration of the first semiconductor layer, formed in a portion on a surface of the first semiconductor substrate, the portion having a predetermined distance from a portion adjacent to the first gate electrode and the second gate electrode along a surface direction of the first semiconductor layer,
   the accumulated signal charges are discharged to the second drain for discharging charges, and
   the first semiconductor layer and the second semiconductor layer are formed so as to be separated from each other on the semiconductor substrate.

3. An active type solid-state imaging device, comprising:
   an image sensor portion formed in a first semiconductor layer of a second conductivity type in a semiconductor substrate of a first conductivity type, having a plurality of active type photoelectric conversion elements arranged one-dimensionally or two-dimensionally; and
   a driving circuit for driving the image sensor portion, formed in a second semiconductor layer of the second conductivity in a semiconductor substrate,
   wherein each of the active type photoelectric conversion elements has:
   a transistor including: a first gate region having a portion of a surface region of the first semiconductor layer in which signal charges generated by photoelectric conversion are accumulated and a first gate electrode formed on the surface region of the first semiconductor layer; and a source and a drain made of layers having an impurity concentration higher than an impurity concentration of the first semiconductor layer, formed on the surface of the first semiconductor layer; and
   a charge discharging portion including: a second gate region having a portion of the surface region of the first semiconductor layer adjacent to the first gate region and a second gate electrode formed on the surface region of the semiconductor layer with an insulating film interposed therebetween so as to be adjacent to the first gate electrode, and discharging the signal charges accumulated in the first gate region into the first semiconductor layer through the second gate region,
   wherein a electric field blocking portion is provided between the charge discharging portion of a first active type photoelectric conversion element and the transistor of a second active type photoelectric conversion element adjacent to the first active type photoelectric conversion element, and the first semiconductor layer and the second semiconductor layer are formed so as to be separated from each other on the semiconductor substrate.

4. An active type solid-state imaging device, comprising:

an image sensor portion including an active type photoelectric conversion element, formed in a first semiconductor layer of a second conductivity type in a semiconductor substrate of a first conductivity type; and a driving circuit for driving the image sensor portion, formed in a second semiconductor layer of the second conductivity in the semiconductor substrate, wherein the active type photoelectric conversion element includes a transistor comprising: a semiconductor region provided on a surface of the first semiconductor layer; a first gate region including a portion of a surface region of the first semiconductor layer in which signal charges generated by photoelectric conversion are accumulated and a first gate electrode formed on the portion of the surface region of the first semiconductor layer; and a second gate region formed on the portion of the surface region of the first semiconductor layer adjacent to the first gate region with an insulating film interposed therebetween, a channel is formed in the portion in the vicinity of the surface of the first gate region between the semiconductor region and the first semiconductor layer and changes in characteristics of the transistor caused by the signal charges are output, and the first semiconductor layer and the second semiconductor layer are formed so as to be separated from each other on the semiconductor substrate.

5. An active type solid-state imaging device according to claim 1, wherein a semiconductor layer of a second conductivity type having an impurity concentration higher than an impurity concentration of the first and second semiconductor layers is formed between the first semiconductor layer and the semiconductor substrate and between the second semiconductor layer and the semiconductor substrate.

6. An active type solid-state imaging device according to claim 2, wherein a semiconductor layer of a second conductivity type having an impurity concentration higher than an impurity concentration of the first and second semiconductor layers is formed between the first semiconductor layer and the semiconductor substrate and between the second semiconductor layer and the semiconductor substrate.

7. An active type solid-state imaging device according to claim 3, wherein a semiconductor layer of a second conductivity type having an impurity concentration higher than an impurity concentration of the first and second semiconductor layers is formed between the first semiconductor layer and the semiconductor substrate and between the second semiconductor layer and the semiconductor substrate.

8. An active type solid-state imaging device according to claim 4, wherein a semiconductor layer of a second conductivity type having an impurity concentration higher than an impurity concentration of the first and second semiconductor layers is formed between the first semiconductor layer and the semiconductor substrate and between the second semiconductor layer and the semiconductor substrate.

* * * * *